(12) United States Patent
Wang et al.

(10) Patent No.: US 10,505,044 B1
(45) Date of Patent: Dec. 10, 2019

(54) SEMICONDUCTOR STRUCTURE, CAPACITOR STRUCTURE THEREOF AND MANUFACTURING METHOD OF THE SAME

(71) Applicant: TAIWAN SEMICONDUCTOR MANUFACTURING COMPANY LTD., Hsinchu (TW)

(72) Inventors: Chin-Shan Wang, Hsinchu (TW); Yi-Miaw Lin, Taipei County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/105,939

(22) Filed: Aug. 20, 2018

(51) Int. Cl.
| | | |
|---|---|---|
| *H01L 29/78* | (2006.01) | |
| *H01L 49/02* | (2006.01) | |
| *H01L 29/423* | (2006.01) | |
| *H01L 23/522* | (2006.01) | |
| *H01L 29/40* | (2006.01) | |
| *H01L 29/66* | (2006.01) | |
| *H01L 29/08* | (2006.01) | |

(52) U.S. Cl.
CPC ........ *H01L 29/785* (2013.01); *H01L 23/5226* (2013.01); *H01L 28/40* (2013.01); *H01L 29/0847* (2013.01); *H01L 29/408* (2013.01); *H01L 29/4232* (2013.01); *H01L 29/66795* (2013.01)

(58) Field of Classification Search
CPC .............. H01L 29/785; H01L 29/0847; H01L 29/66795; H01L 29/408; H01L 29/4232; H01L 28/40; H01L 23/5226
See application file for complete search history.

(56) References Cited

U.S. PATENT DOCUMENTS

| | | | |
|---|---|---|---|
| 9,893,145 B1* | 2/2018 | Cheng | H01L 28/60 |
| 2017/0040354 A1* | 2/2017 | Smith | H01L 27/13 |
| 2018/0090492 A1* | 3/2018 | Ranjan | H01L 23/5226 |
| 2018/0277688 A1* | 9/2018 | Hwang | H01L 29/94 |

* cited by examiner

*Primary Examiner* — Syed I Gheyas
(74) *Attorney, Agent, or Firm* — WPAT, P.C., Intellectual Property Attorneys; Anthony King

(57) ABSTRACT

The present disclosure provides a semiconductor structure, including: a substrate having a gate structure; a first interlayer over the substrate; a contact adjacent to the gate structure and penetrating through the first interlayer; a dielectric layer over the first interlayer and the contact; a conductive plug electrically connecting with the gate structure and penetrating the first interlayer; and a conductive bridge electrically connecting with the conductive plug and being directly over the contact, the conductive bridge being separated from the contact by a portion of the dielectric layer.

20 Claims, 25 Drawing Sheets

SEMICONDUCTOR STRUCTURE, CAPACITOR STRUCTURE THEREOF AND MANUFACTURING METHOD OF THE SAME

BACKGROUND

A capacitor (originally known as a condenser) is an electrical component used to store potential energy in an electrical field and is designed for enhance capacitance to a circuit of an electronic and electrical system, including power supply, digital frequency filter, signal filter, analog filter, resonate circuit, electric transmission system, and etc.

A large variety of different types of capacitors are available in the market. Physical forms and constructions of capacitors vary widely, and many types of capacitors are in common use. A capacitor usually has two conductors in a form of plate separated by a dielectric medium. The dielectric medium acts to increase charge capacity of the capacitor. When two conductors of a capacitor experience voltage difference, an electrical field is developed causing a net positive charge to collect on one conductor and a net negative charge to collect on the other conductor. Capacitance relates to the ratio of electric charges on the two conductors and potential difference between them. The capacitance of a capacitor is proportional to the surface area of the conductors and inversely to the gap between the two conductors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
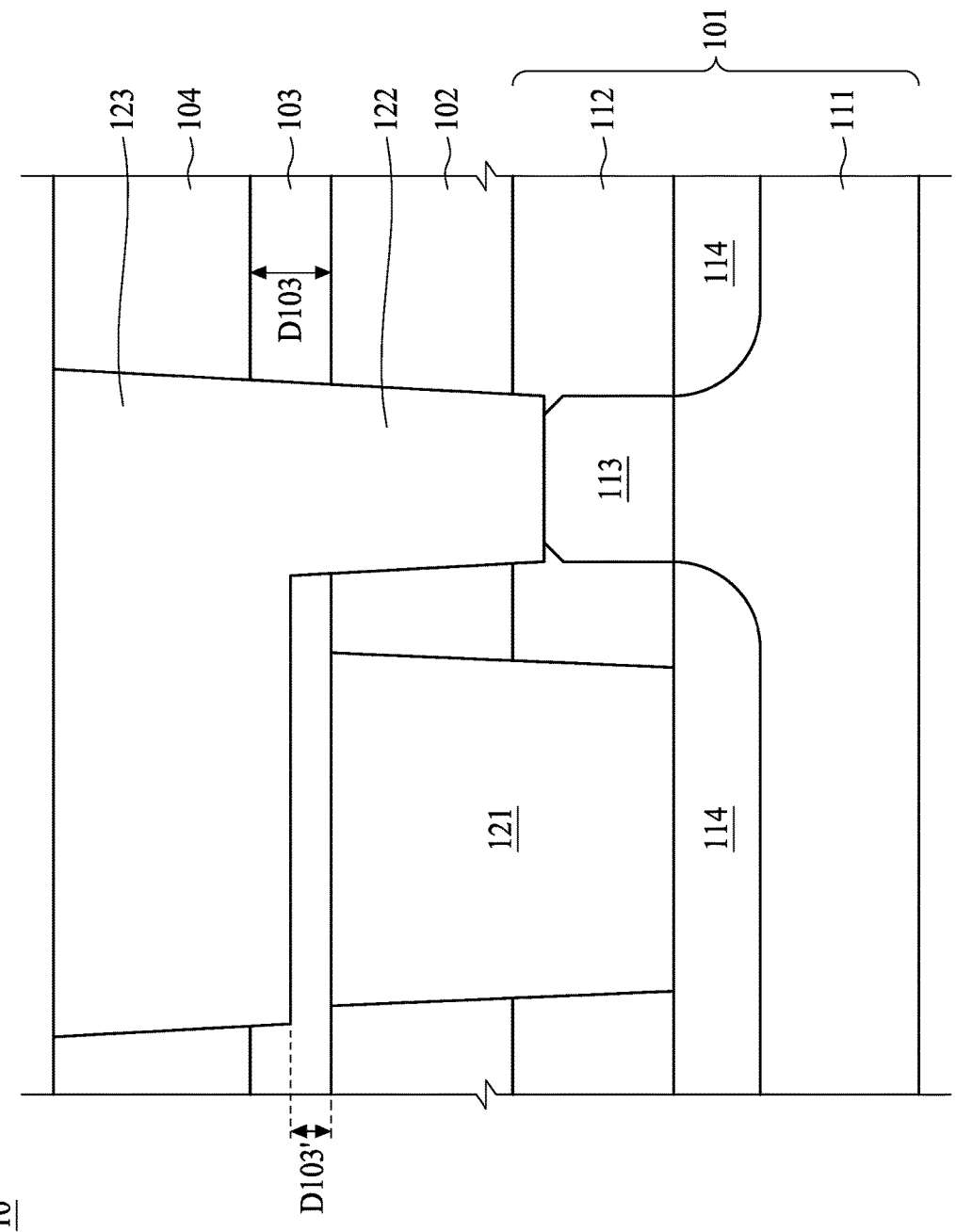
FIG. 1 is a cross section of a semiconductor structure, in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms.

These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Referring to FIG. 1 shown a cross sectional view of a semiconductor structure 10 in accordance with an embodiment of the present disclosure, the semiconductor structure 10 includes: a substrate 101, a first interlayer 102, a contact 121, a dielectric layer 103, a second interlayer 104, a conductive plug 122, and a conductive bridge 123. The substrate 101 may be a semiconductor substrate, for example a CMOS (complementary metal oxide semiconductor) substrate, including at least essential components to function a fundamental circuit. As an exemplar to illustrate the present disclosure, as shown in FIG. 1, the substrate 101 includes a base 111, an insulating layer 112 over the base 111, a gate structure 113 formed over the substrate 111 and within the insulating layer 112, and a source/drain region 114 adjacent to the gate structure within the base 111. However the cross section as shown in FIG. 1 is for illustration but not to limit the present disclosure. The base 111 can be polysilicon, and the substrate 101 may include other elements, such as LDD (light doped drain) region, N well, P well, N deep well, P deep well, spacers, gate oxide layer, contact region on top of the source/drain region, and etc. Conventional structures can be applied to receive desired performance and requirements.

The first interlayer 102 is formed over the substrate 101. The contact 121 is adjacent to the gate structure 113 and penetrates through the first interlayer 102 to electrically connect with the source/drain region 114. The contact 121 may physically contact with the source/drain region 114, or indirectly contact the source/drain region 114 through a contact pad for instance, to electrically connect with the source/drain region 114. It is not limited herein. As shown in FIG. 1, a top of the gate structure 113 is below a top surface of the insulating layer 112, and the contact plug 122 also penetrate a portion of the insulating layer 112 directly over the gate structure 113. However in other embodiments of the present disclosure, a top of the gate structure 113 can be coplanar to a top surface of the insulating layer 112. The dielectric layer 103 is formed over the first interlayer 102 and the contact 121. The conductive plug 122 penetrates through the first interlayer 102 and electrically connects with the gate structure 113. The gate structure 113 can be a metal gate or polysilicon gate; and the conductive plug 122 may physically contact with the gate structure 113, or indirectly through silicide for instance, to electrically connect with the gate structure 113. The gate structure 113 is a metal gate structure in the embodiment shown in FIG. 1, but it is not limited herein.

The conductive bridge 123 is formed directly over the contact 121, overlaps with at least a portion of the contact 121 from a top view perspective, and electrically connects with the conductive plug 122. The conductive bridge 123 is separated from the contact 121 by a portion of the dielectric layer 103. The second interlayer 104 is formed over the dielectric layer 103. The conductive bridge 123 is formed within the second interlayer 104 and penetrates through the second interlayer, extending to the underlying dielectric layer 103. The conductive bridge 123 is surrounded by the second interlayer 104.

As shown in FIG. 1 of the semiconductor structure 10, the conductive plug 122 is separated from the contact 121 by the first interlayer 102, and thus a first capacitor is created and defined by a stack of a portion of the conductive plug 122, a portion of the first interlayer 102 and a portion of the contact 121. A distance between the contact 121 and the conductive plug 122 is adjusted to control the capacitance of the first capacitor, and the distance is not limited herein as long as normal functioning on applications. The first capacitor may also include a stack of a portion of the metal gate 113, a portion of the first interlayer 102, and a portion of the contact 121. For example, the first capacitor is in general a vertical capacitor in the semiconductor structure 10.

The semiconductor structure 10 as shown in FIG. 1, the conductive bridge 123 is separated from the contact 121 by the portion of the dielectric layer 103, and thus a second capacitor is created and defined by a stack of a portion of the conductive bridge 123, the portion of the dielectric layer 103, and a portion of the contact 121. A distance between the contact 121 and the conductive bridge 123 is adjusted to control the capacitance of the second capacitor. In other words, a thickness D103' of the portion of the dielectric layer 103 is adjusted to control the capacitance of the second capacitor. In some embodiments of the present disclosure, the thickness D103' is less than a thickness D103 of where the dielectric layer 103 free from coverage by the conductive bridge 123 as shown in FIG. 1. In some embodiments of the present disclosure in accordance with FIG. 2 of a cross sectional view of a semiconductor structure 11, the thickness D103' is equal to the thickness D103 of where the dielectric layer 103 being free from coverage by the conductive bridge 123. It is noted that the same reference numerals are repeatedly used to the elements with same or similar functions or properties in various embodiments for the purpose of simplicity and clarity but not to limit the present disclosure.

The first interlayer 102 and the second interlayer 104 are dielectric, and materials of the first and second interlayers 102 and 104 can be the same or different. However, material of the dielectric layer 103 is different from those of the first interlayer 102 and the second interlayer 104. In some embodiment of the present disclosure, the dielectric layer 103 and the first interlayer 102 differ in etch rate to a predetermined etchant to control the thickness D103' of the portion of the dielectric layer 103. Detailed manufacturing method is provided later in the specification. In an embodiment of the present disclosure, the first interlayer 102 and the second interlayer 104 are silicon oxide, and the dielectric layer 103 is silicon nitride.

Figure 2:
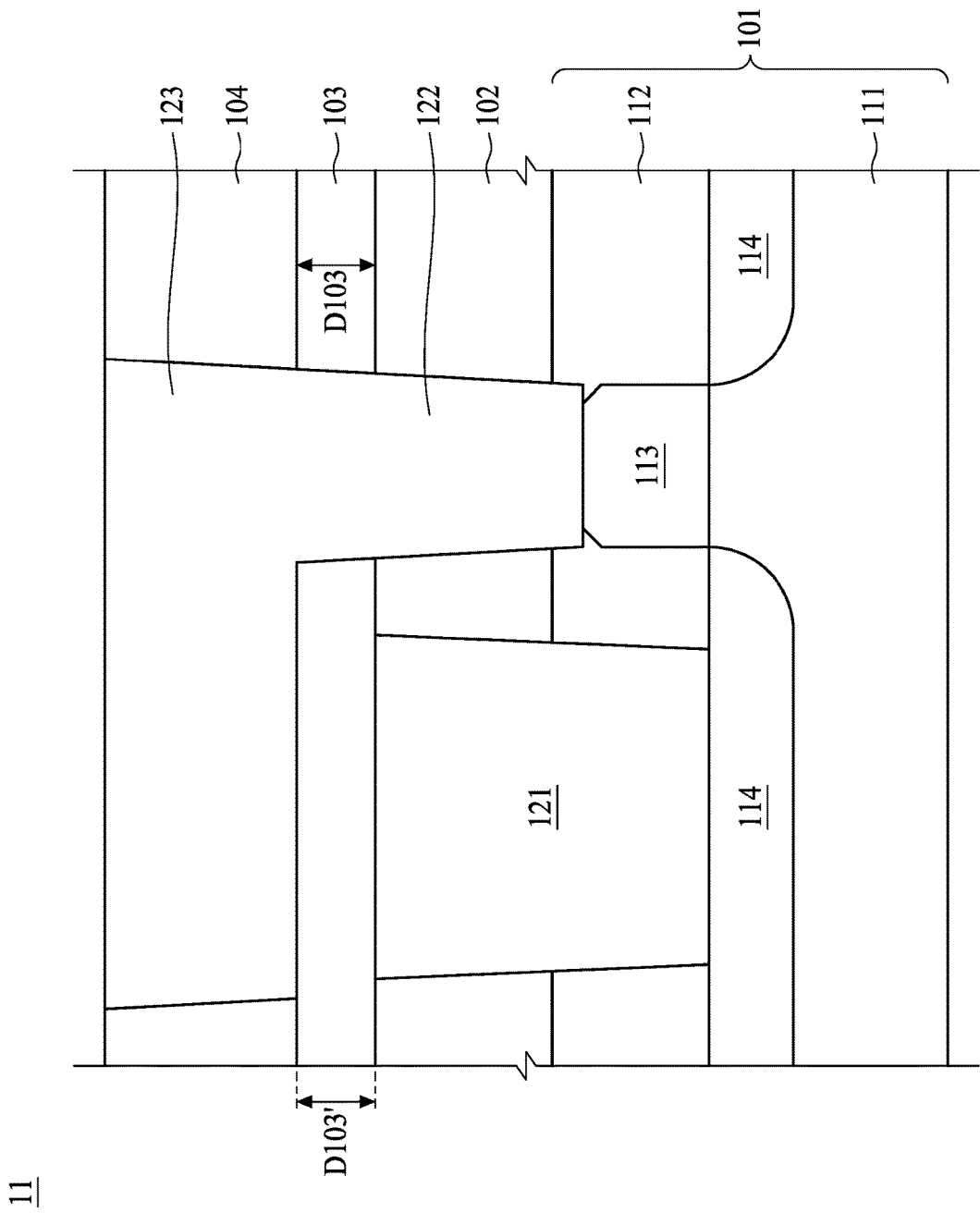
FIG. 2 is a cross section of a semiconductor structure, in accordance with an embodiment of the present disclosure.
Figure 3:
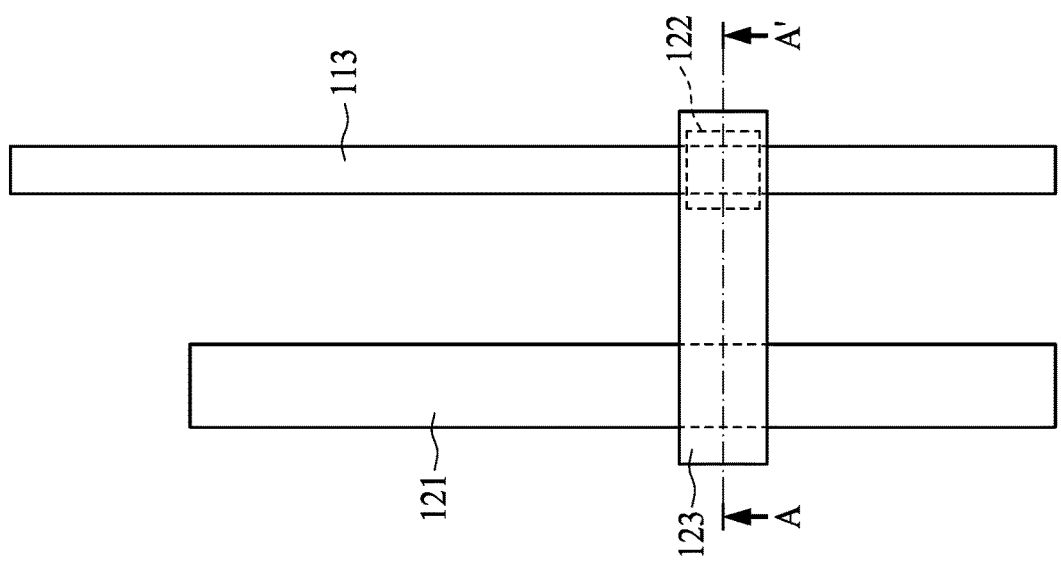
FIG. 3 is a top view of a semiconductor structure, in accordance with an embodiment of the present disclosure.

FIG. 3 is a top view of the semiconductor structure 10 in accordance with an embodiment of the present disclosure. Referring to FIG. 3, the contact 121 and the gate structure 113 are parallel, and the contact 121 and the gate structure 113 have the same longitudinal direction. The conductive plug 122 directly covers a portion of the gate structure 113 and electrically connects with the gate structure 113 and the conductive bridge 123. The conductive bridge 123 directly covers at least a portion of the conductive plug 122 and has a longitudinal direction perpendicular to the longitudinal direction of the contact 121. In the implementation shown in FIG. 3, the conductive bridge directly traverses over the contact 121 and the gate structure 113. The semiconductor structure 10 shown in FIG. 1 is a cross sectional view along a line A-A' in FIG. 3. In addition, the semiconductor structure 11 shown in FIG. 2 can share the same top view as shown in FIG. 3 since a difference between embodiments shown in FIG. 1 and FIG. 2 is merely that the thickness D103' is less than the thickness D103 in FIG. 1 but is equal to the thickness D103 in FIG. 2.

The present disclosure provides a semiconductor structure with horizontally and vertically stacked capacitors integrated therein to improve capacitance with limited or zero increment of the layout area. Based on the concept as descripted above, various embodiments are provided below from different aspects to illustrate the present disclosure more clearly and in detail.

Figure 4:
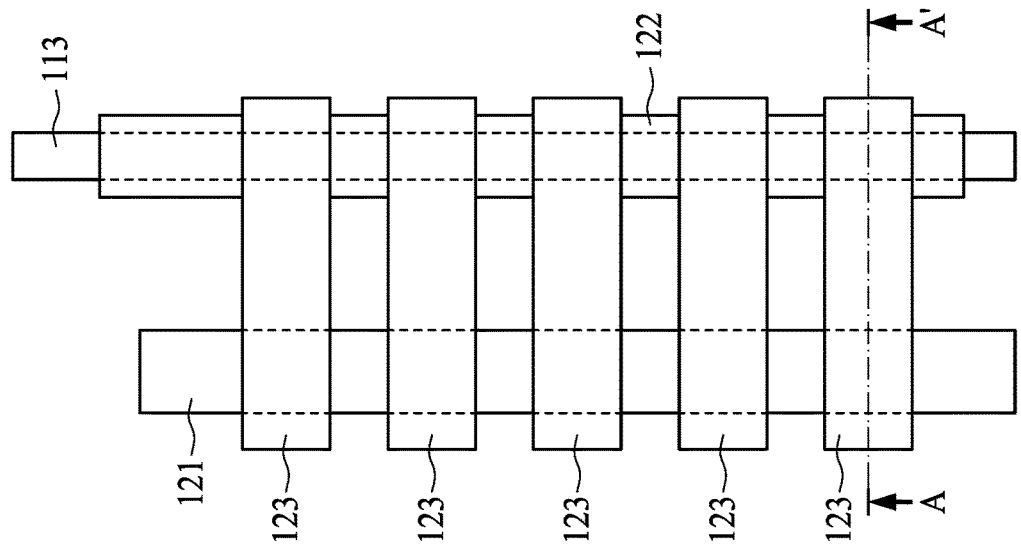
FIG. 4 is a top view of a semiconductor structure, in accordance with an embodiment of the present disclosure.
Figure 4:
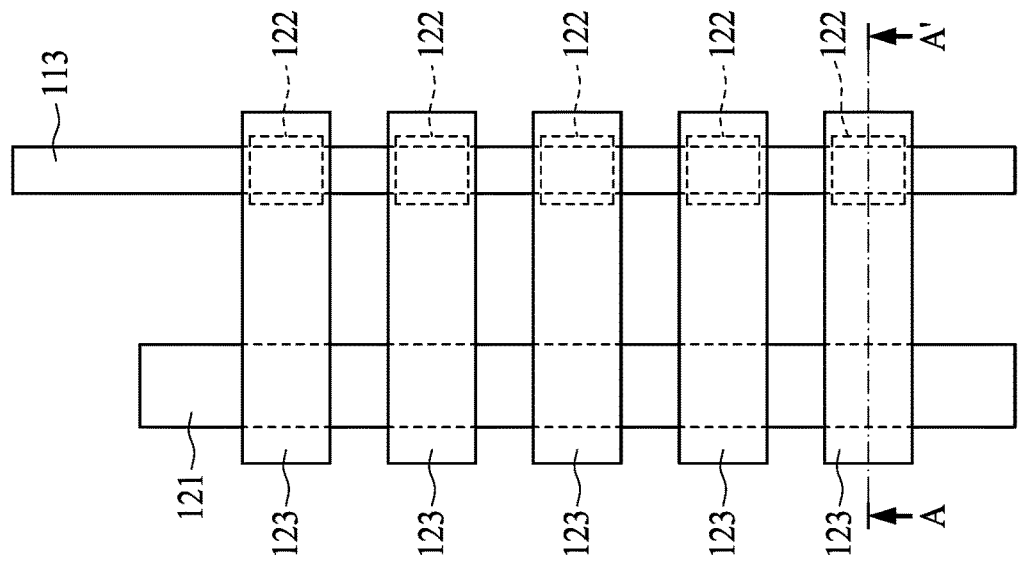

FIG. 4 is a top view of a semiconductor structure in accordance with an embodiment of the present disclosure. Referring to FIG. 4 comparing with the implementations shown in FIG. 3, there is a plurality of conductive bridges 123 disposed side by side along a direction same as a longitudinal direction of the contact 121. The conductive plugs 122 are directly over the gate structure 113. The plurality of conductive bridges 123 forms a grid pattern across over the contact 121, the gate structure 113 and the conductive plugs 122. Similar to the implementations shown in FIG. 3, individual of the plurality of conductive bridges 123 has a longitudinal direction perpendicular to the longitudinal direction of the contact 121 and traverses over the contact 121. It is noted that FIG. 4 shows five conductive plugs 122, but a number of conductive plugs 122 is not limited herein. Other properties of the elements of FIG. 4 is similar or the same to FIG. 3. Implementations of the semiconductor structures 10 and 11 as shown in FIG. 1 and FIG. 2 respectively can be applied to the top view as shown in FIG. 4 (FIG. 1 or FIG. 2 may be a cross section along line A-A' in FIG. 4) since a difference between embodiments shown in FIG. 1 and FIG. 2 is merely that the thickness D103' is less than the thickness D103 in FIG. 1 but is equal to the thickness D103 in FIG. 2.

Figure 5:
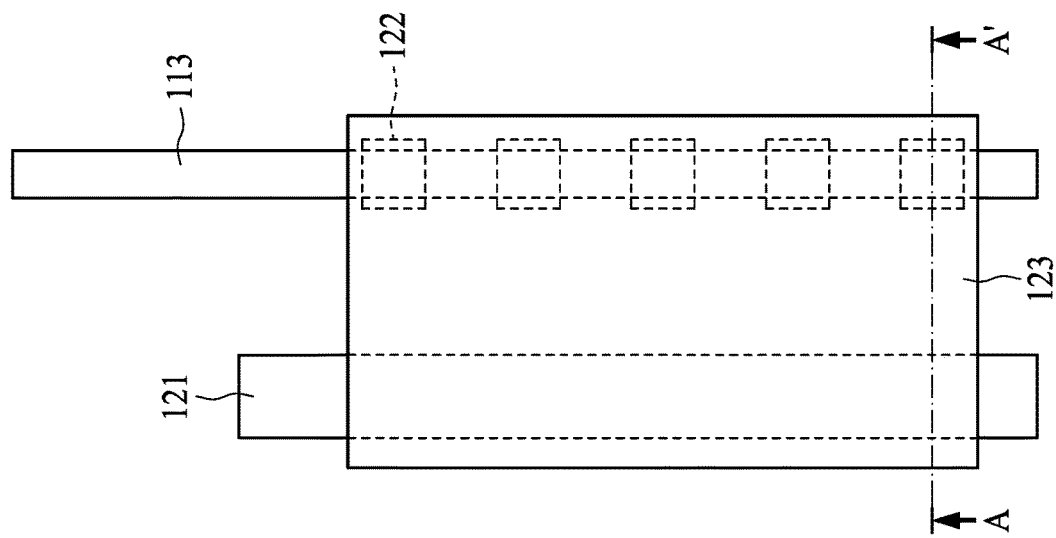
FIG. 5 is a top view of a semiconductor structure, in accordance with an embodiment of the present disclosure.

FIG. 5 is a top view of a semiconductor structure in accordance with an embodiment of the present disclosure. A difference between the structures as in FIG. 4 and FIG. 5 is arrangement of the conductive bridge 123. In FIG. 4, the plurality of conductive bridges 123 individually is across over the corresponding conductive plug 122 and the contact 121; and the embodiment shown in FIG. 5 includes one conductive bridge 123 across over the conductive plugs 122 and the contact 121 and with larger coverage area on the contact 121 and the conductive plugs 122. In the embodiment as shown in FIG. 5, the conductive bridge 123 has a longitudinal direction same as a longitudinal direction of the contact 121. Implementations of the semiconductor structures 10 and 11 as shown in FIG. 1 and FIG. 2 respectively can be applied to the top layout as shown in FIG. 5 (FIG. 1 or FIG. 2 may be a cross section along line A-A' in FIG. 5) since a difference between embodiments shown in FIG. 1 and FIG. 2 is merely that the thickness D103' is less than the thickness D103 in FIG. 1 but is equal to the thickness D103 in FIG. 2.

Figure 6:
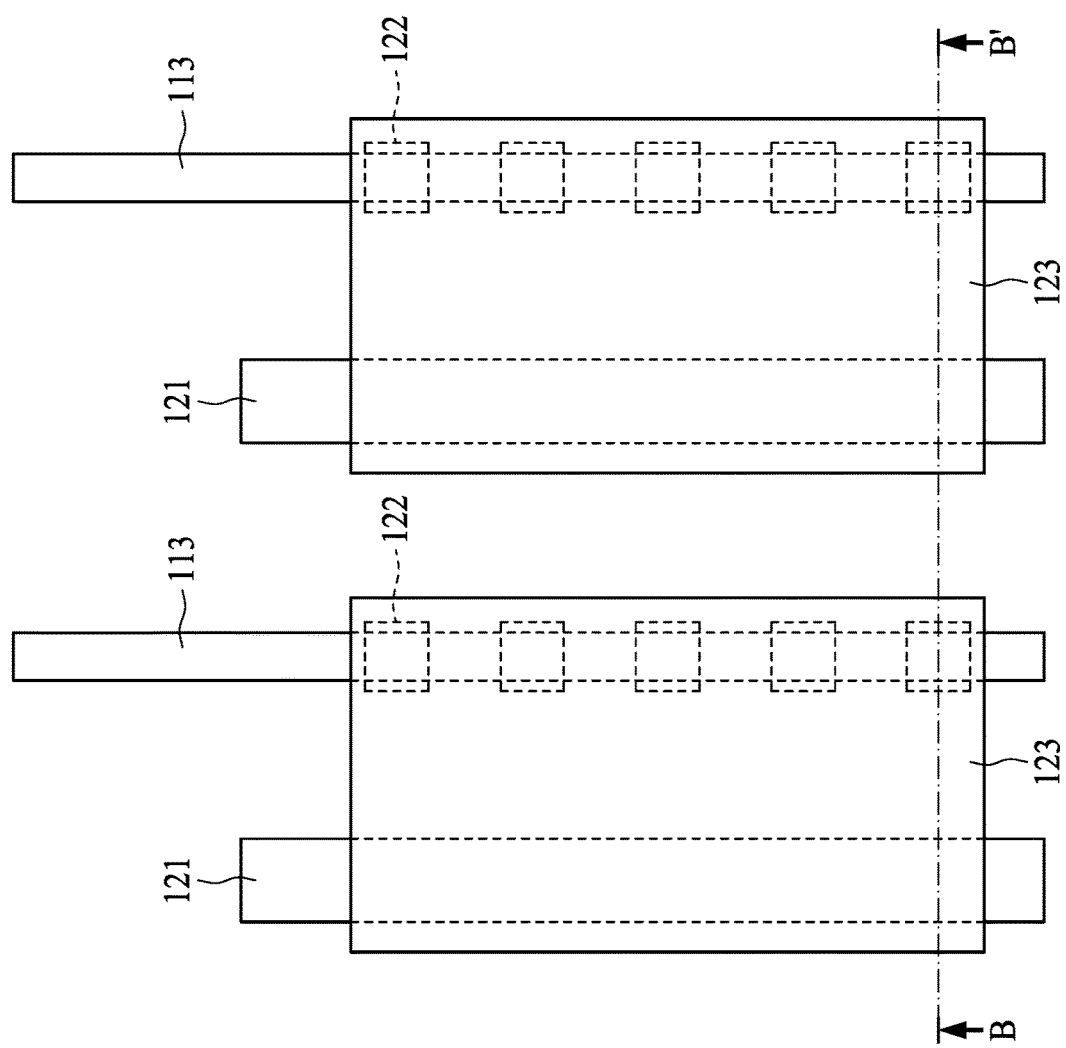
FIG. 6 is a top view of a semiconductor structure, in accordance with an embodiment of the present disclosure.
Figure 7:
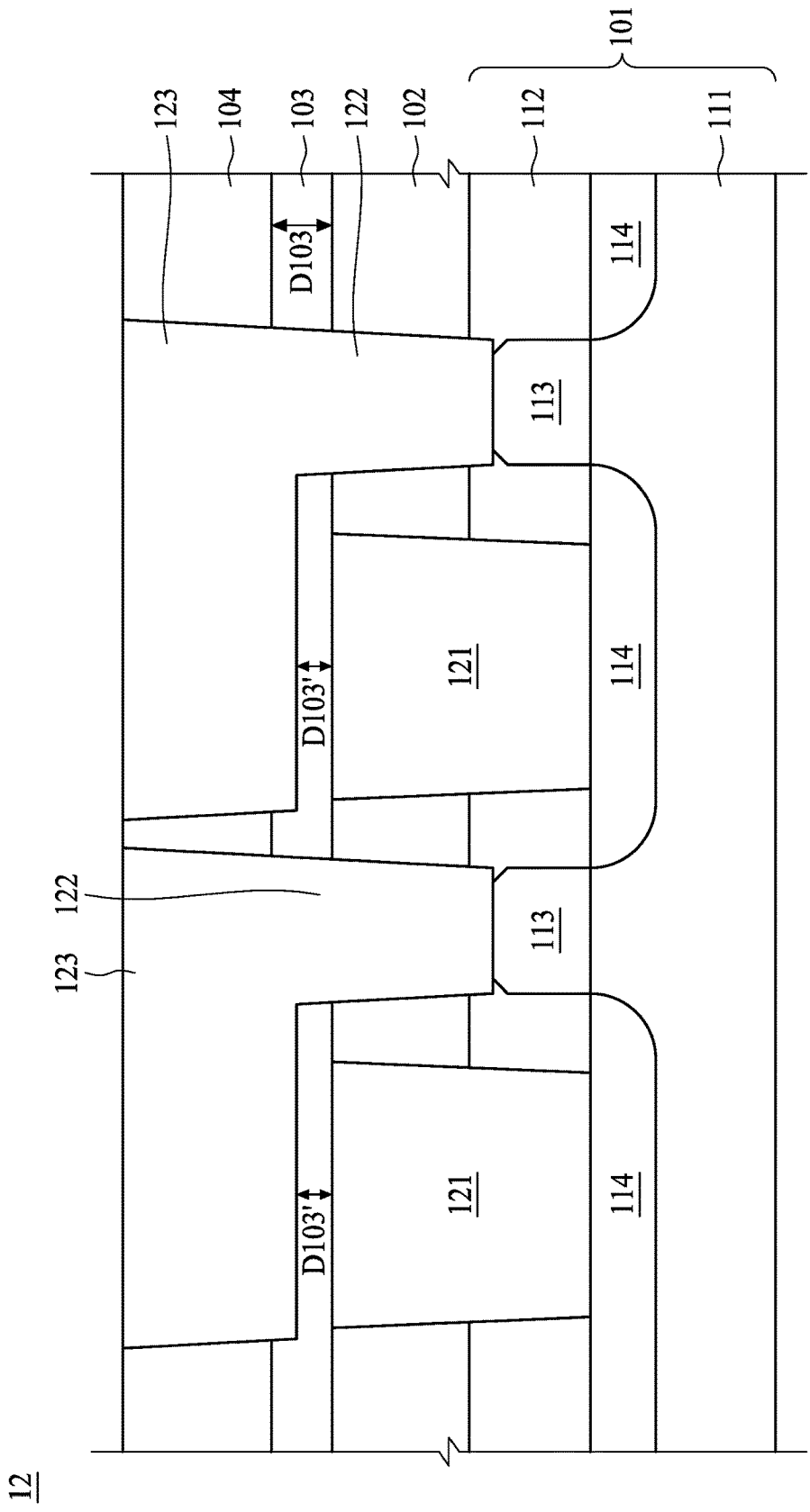
FIG. 7 is a cross section of a semiconductor structure, in accordance with an embodiment of the present disclosure.

In some embodiments of the present disclosure, the structures as shown in the top view perspectives of FIG. 3, FIG. 4 and FIG. 5 can be repeatedly disposed to increase area of the capacitors formed therewithin a semiconductor structure. For example, FIG. 6 is a top view of a semiconductor structure 12 shown in FIG. 7, which is a cross sectional view of the semiconductor structure 12 in accordance with an embodiment of the present disclosure. FIG. 6 includes two repeated unit of FIG. 5, and elements and features are similar to or same as the corresponding reference numbers in other embodiments as illustrated in the disclosure. As shown in FIG. 7, the semiconductor structure 12 includes two repeated unit of FIG. 1, but it is not limited to therein. In other embodiments of the present disclosure, unit of FIG. 2 and FIG. 4 are repeatedly applied to form a semiconductor structure. Cross sections as shown in FIG. 1 or FIG. 2 can be applied to top view as shown in FIG. 3, FIG. 4 or FIG. 5 as a unit, and the unit can be repeated to provide larger capacitance due to larger parallel area of the stacked conductor-insulator-conductor structure.

Figure 8:
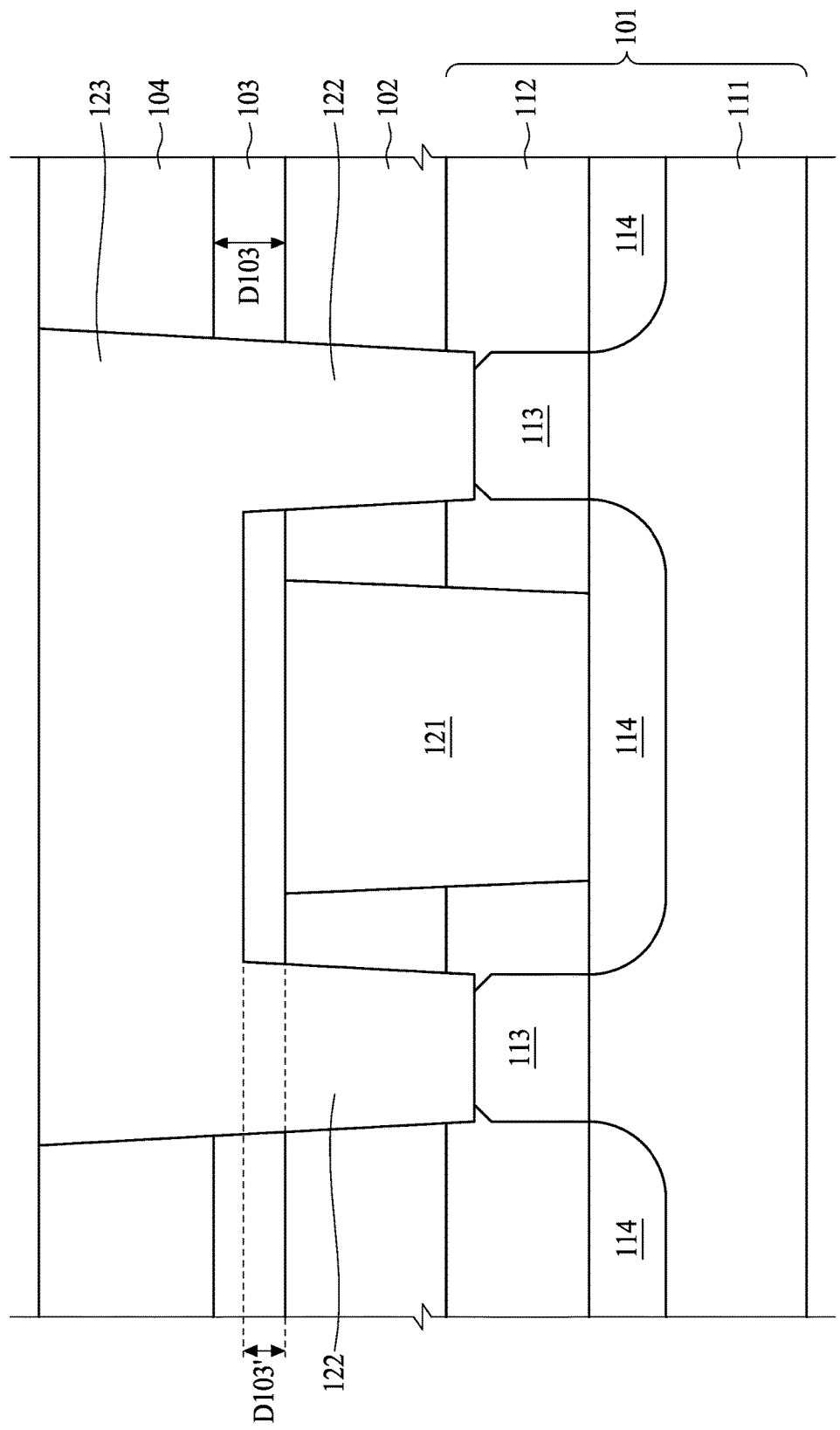
FIG. 8 is a cross section of a capacitor structure, in accordance with an embodiment of the present disclosure.

FIG. 8 is a cross section of a semiconductor structure 20 in accordance with an embodiment of the present disclosure. The semiconductor structure 20 can be a capacitor structure, and includes a substrate 101, a first interlayer 102, a contact 121, a dielectric layer 103, a second interlayer 104, a plurality of conductive plugs 122, and a conductive bridge 123. The substrate 101 may be a semiconductor substrate, for example a CMOS (complementary metal oxide semiconductor) substrate, and may include a base 111, an insulating layer 112 over the base 111, a plurality of gate structures 113 formed over the substrate 111 and within the insulating layer 112, and a plurality of source/drain regions 114 adjacent to the plurality of gate structures 113 within the base 111. The substrate 101 may include other elements and features similar to the substrate 101 as illustrated in FIG. 1.

The first interlayer 102 is formed over the substrate 101. The contact 121 is formed between two adjacent gate structures 131 of the plurality of gate structures 131 and penetrates through the first interlayer 102 to electrically connect with one of the plurality of source/drain regions 114 between the two adjacent gate structures 113. The contact 121 may physically contact with the source/drain region 114, or indirectly contact the source/drain region 114 through a contact pad for instance, to electrically connect with the source/drain region 114. It is not limited herein. The dielectric layer 103 is formed over the first interlayer 102 and the contact 122. The plurality of conductive plugs 122 individually penetrates through the first interlayer 102 and electrically connects with the plurality of gate structure 113. The gate structures 113 can be metal gate structures or polysilicon gate structures; and individual of the plurality of conductive plugs 122 may physically contact with individual of the plurality of the gate structures 113, or indirectly contact through silicide for instance, to electrically connect with individual of the plurality of gate structures 113. It is not limited herein. Thus, two adjacent conductive plugs 122 of the plurality of conductive plugs 122 respectively connect with the two adjacent gate structures 113, and the contact 121 is between the two adjacent conductive plugs 122.

The conductive bridge 123 is formed directly over the contact 121 and traverses the contact 121 to electrically connect with the plurality of conductive plugs 122. The conductive bridge 123 is separated from the contact 121 by at least a portion of the dielectric layer 103. The second interlayer 104 is formed over the dielectric layer 103. The conductive bridge 123 is formed within the second interlayer 104 and penetrates through the second interlayer 104. The conductive bridge 123 is surrounded by the second interlayer 104.

As shown in FIG. 8 of the semiconductor structure 20, the plurality of conductive plugs 122 is separated from the contact 121 by the first interlayer 102, and thus a first capacitor is created and defined by a stack of a portion of the conductive plug 122 on the left hand side, a portion of the first interlayer 102 and a portion of the contact 121. A distance between the contact 121 and the conductive plug 122 on the left hand side can be adjusted to control the capacitance of the first capacitor, and the distance is not limited herein as long as normal functioning on applications. The first capacitor may also include a stack of a portion of the metal gate 113, a portion of the first interlayer 102, and a portion of the contact 121. For example, the first capacitor is in general a vertical capacitor in the semiconductor structure 20.

The semiconductor structure 20 as shown in FIG. 8, the conductive bridge 123 is separated from the contact 121 by the portion of the dielectric layer 103, and thus a second capacitor is created and defined by a stack of a portion of the conductive bridge 123, the portion of the dielectric layer 103, and a portion of the contact 121. A distance between the contact 121 and the conductive bridge 123 can be adjusted to control the capacitance of the second capacitor. In other words, a thickness D103' of the portion of the dielectric layer 103 is adjusted to control the capacitance of the second capacitor. In some embodiments of the present disclosure, the thickness D103' is less than a thickness D103 of where the dielectric layer 103 free from coverage by the conductive bridge 123 as shown in FIG. 8. In some embodiments of the present disclosure in accordance with FIG. 9 of a cross section of a semiconductor structure 21, the thickness D103' is equal to the thickness D103 of where the dielectric layer 103 being free from coverage by the conductive bridge 123. It is noted that the same reference numerals are repeatedly used to the elements with same or similar functions or properties in various embodiments for the purpose of simplicity and clarity but not to limit the present disclosure.

The semiconductor structure 20 as shown in FIG. 8, the plurality of conductive plugs 122 are separated from the contact 121 by the first interlayer 102, and thus a third capacitor is created and defined by a stack of a portion of the conductive plug 122 on the right hand side, a portion of the first interlayer 102 and a portion of the contact 121. A distance between the contact 121 and the conductive plug 122 on the right hand side can be adjusted to control the capacitance of the third capacitor, and the distance is not limited herein as long as normal functioning on applications. Similarly, the third capacitor may also include a stack of a portion of the metal gate 113, a portion of the first interlayer 102, and a portion of the contact 121. For example, the third capacitor is in general a vertical capacitor in the semiconductor structure 20.

The first interlayer 102 and the second interlayer 104 are dielectric, and materials of the first and second interlayers 102 and 104 can be the same of different. However, material of the dielectric layer 103 is different from those of the first interlayer 102 and the second interlayer 104. Physical and chemical properties of the first interlayer 102, the second interlayer 104 and the dielectric layer 103 are similar to that of the corresponding elements as illustrated in FIG. 1. In an embodiment of the present disclosure, the first interlayer 102 and the second interlayer 104 are silicon oxide, and the dielectric layer 103 is silicon nitride.

Figure 9:
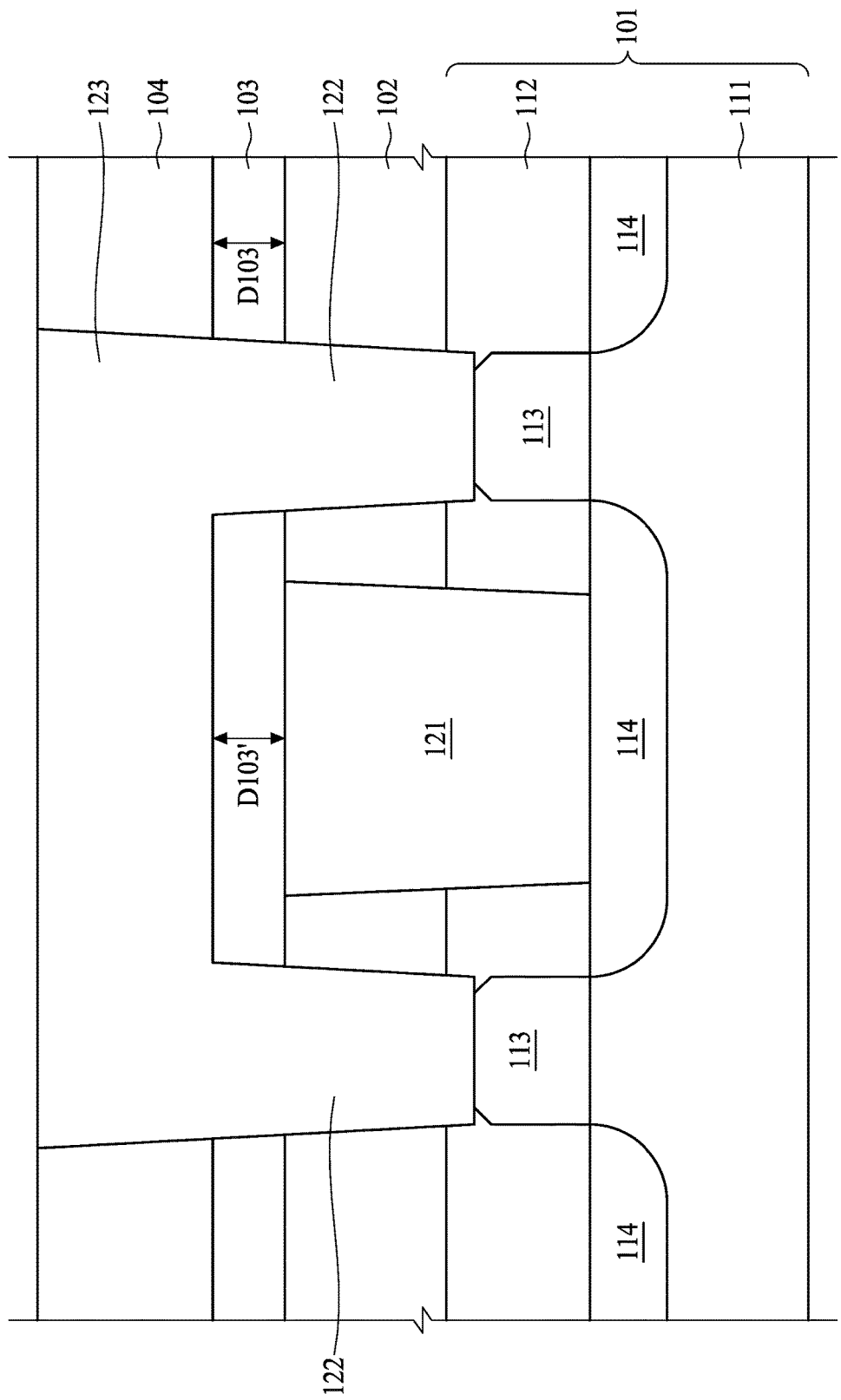
FIG. 9 is a cross section of a capacitor structure, in accordance with an embodiment of the present disclosure.
Figure 10:
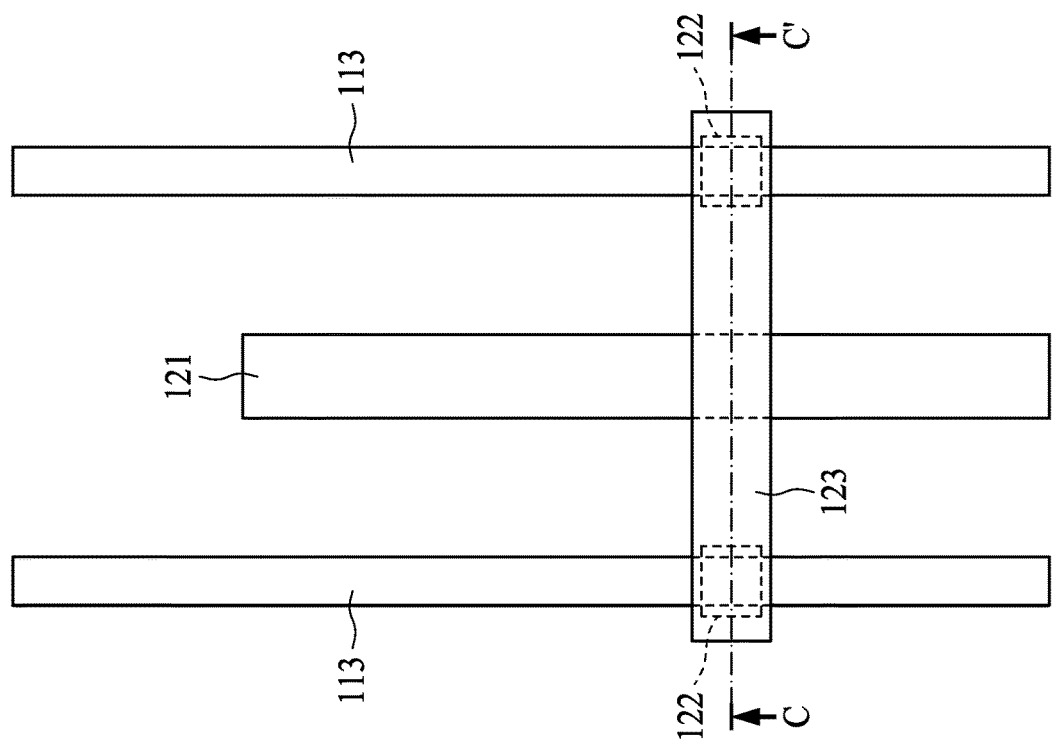
FIG. 10 is a top view of a capacitor structure, in accordance with an embodiment of the present disclosure.

FIG. 10 is a top view of the semiconductor structure 20 in accordance with an embodiment of the present disclosure. Referring to FIG. 10, the contact 121 and the plurality of gate structures 113 are parallel, and the contact 121 and the gate structures 113 have the same longitudinal direction. Individual of the plurality of conductive plugs 122 directly covers a portion of individual of the plurality of gate structures 113 and electrically connects with the plurality of gate structures 113 and the conductive bridge 123. For example, each of the conductive plugs 122 may be a square from a top view perspective. The conductive bridge 123 directly covers at least a portion of each of the conductive plugs 122 and has a longitudinal direction perpendicular to the longitudinal direction of the contact 121. In the implementation shown in FIG. 10, the conductive bridge 123 directly traverses over the contact 121. The semiconductor structure 20 shown in FIG. 8 is a cross sectional view along line C-C' in FIG. 10. In addition, the semiconductor structure 21 shown in FIG. 9 can share the same top view shown in FIG. 10 since a difference between embodiments shown in FIG. 8 and FIG. 9 is merely that the thickness D103' is less than the thickness D103 in FIG. 8 but is equal to the thickness D103 in FIG. 9.

Figure 11:
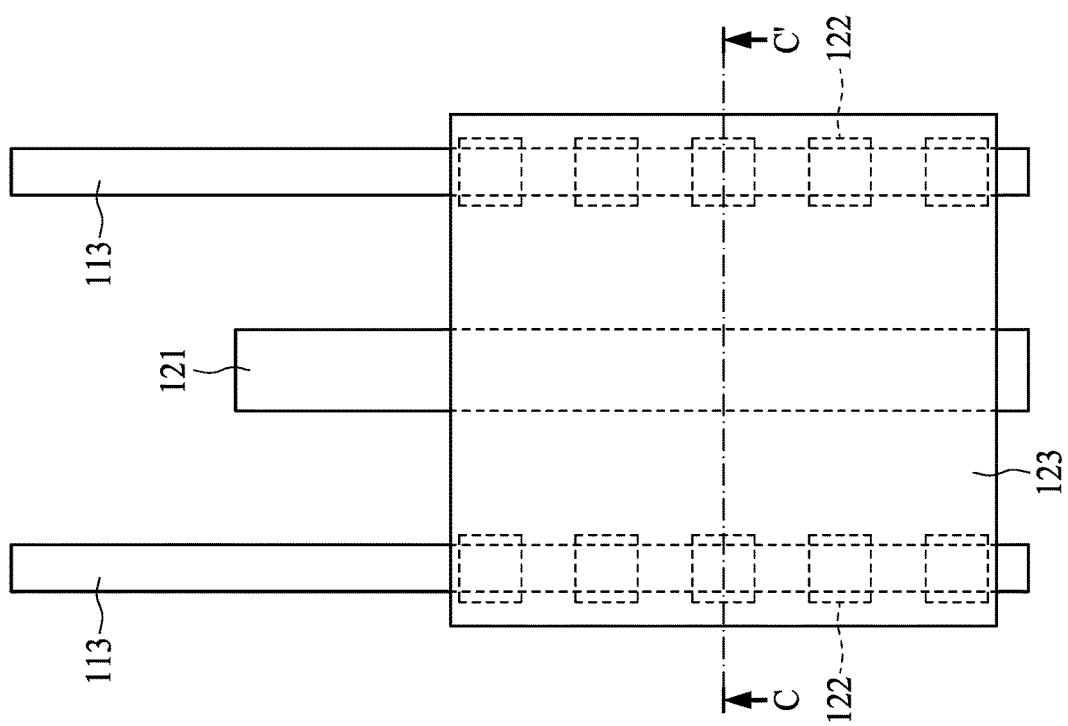
FIG. 11 is a top view of a capacitor structure, in accordance with an embodiment of the present disclosure.

FIG. 11 is a top view of a semiconductor structure in accordance with an embodiment of the present disclosure. Referring to FIG. 11 comparative to the implementation shown in FIG. 10, individual of the plurality of the conductive plugs 122 directly covers a portion of individual of the plurality of gate structures 113. Moreover, the conductive bridge 123 in current embodiment has a larger coverage area relative to the conductive bridge 123 in FIG. 10 by extending parallel to the longitudinal direction of the contact 121 and the gate structures 113. In some embodiment of the present disclosure, the conductive bridge 123 may be a square from the top view perspective and may not have an obvious longitudinal direction; and in some embodiment of the present disclosure, the conductive bridge 123 may be a rectangle from the top view perspective, and have a longitudinal direction same as the longitudinal direction of the conductive plugs 122. Implementations of the semiconductor structures 20 and 21 as shown in FIG. 8 and FIG. 9 respectively can be applied to the top layout as shown in FIG. 11 (FIG. 8 or FIG. 9 may be a cross section along line C-C' in FIG. 11) since a difference between embodiments shown in FIG. 8 and FIG. 9 is merely that the thickness D103' is less than the thickness D103 in FIG. 1 but is equal to the thickness D103 in FIG. 2.

Figure 12:
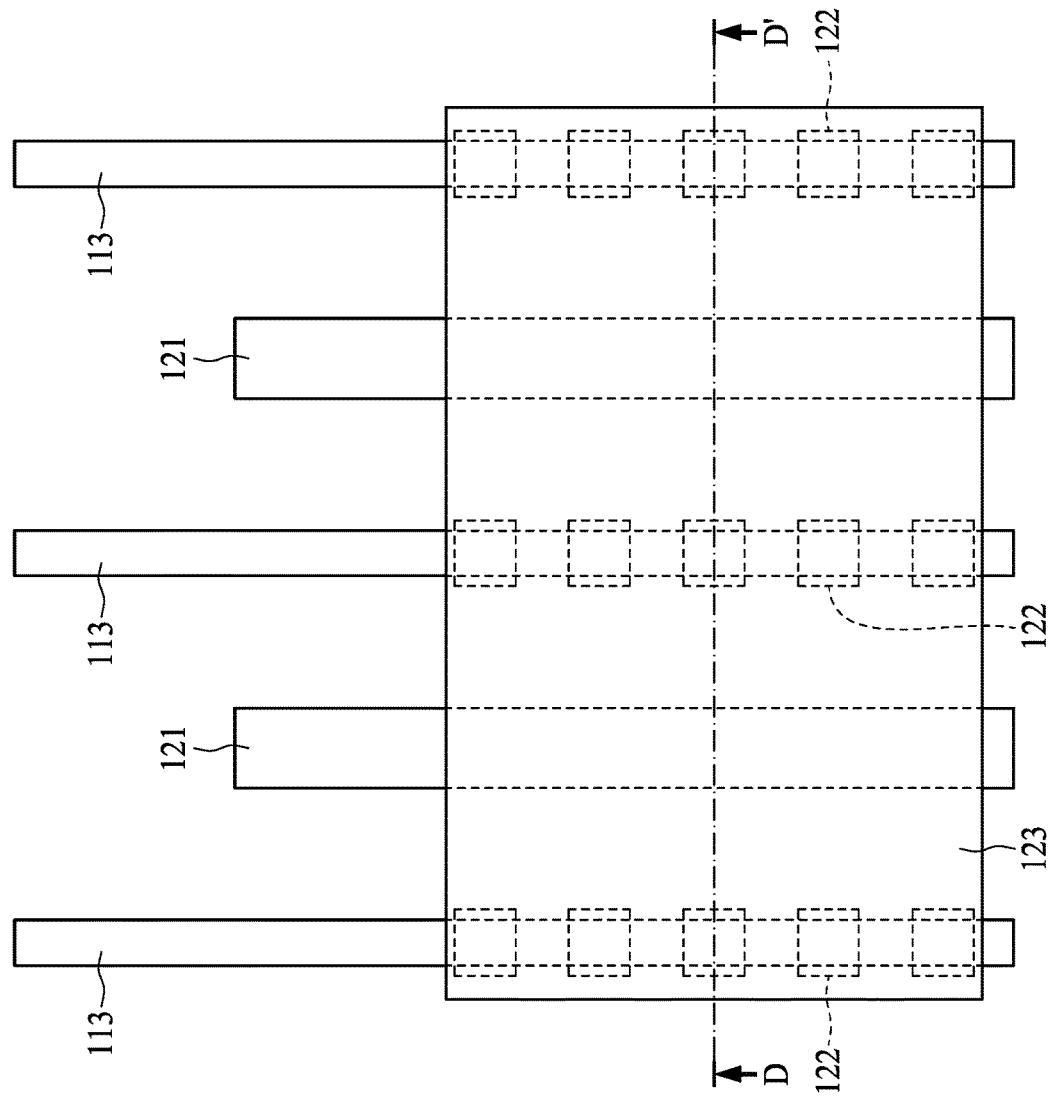
FIG. 12 is a top view of a capacitor structure, in accordance with an embodiment of the present disclosure.
Figure 13:
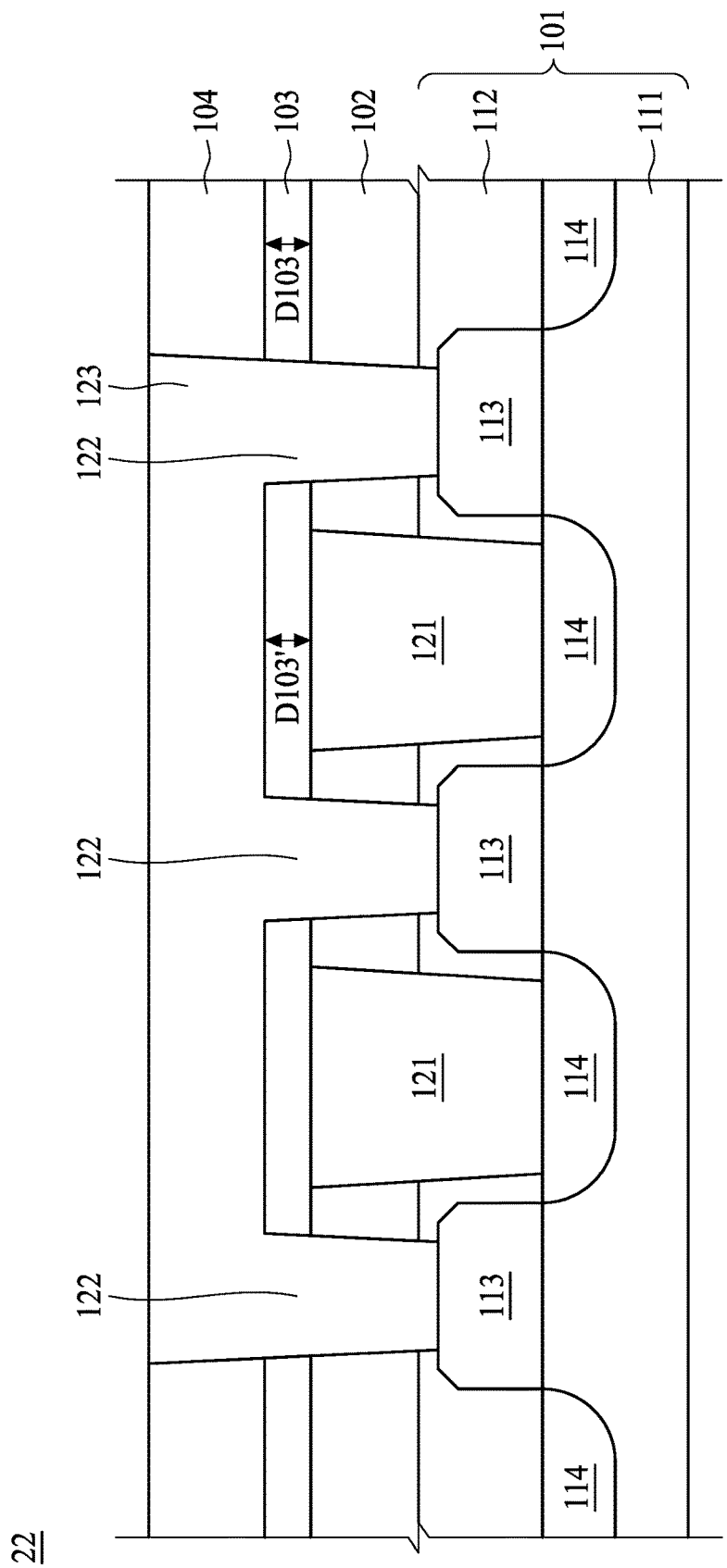
FIG. 13 is a cross section of a capacitor structure, in accordance with an embodiment of the present disclosure.

FIG. 12 is a top view of a semiconductor structure 22 in accordance with an embodiment of the present disclosure, and FIG. 13 is a cross sectional view of the semiconductor structure 22. Referring to FIG. 12 comparative to the implementation shown in FIG. 11, a plurality of contacts 121 is provided. The plurality of the contacts 121 and the plurality of the conductive plugs 122 are intervally disposed, and the contacts 121 are disposed side by side along a direction perpendicular to a longitudinal direction of individual conductive plug 122. Each of the plurality of contacts 121 has a longitudinal direction same as the longitudinal direction of the conductive plug 122. The conductive bridge 123 in FIG.

12 has a larger coverage area to the contacts 121 than that of in FIG. 11 by traversing two adjacent contacts 121. The conductive bridge 123 is directly disposed across and traverses over the plurality of contacts 121. A vertical distance between the conductive bridge 123 and the plurality of contacts 121 is adjusted to control capacitance of the capacitor; and in other words, a thickness D103' of a portion of the dielectric layer 103 between the contact 121 and the conductive bridge 123 is adjusted to control capacitance. In the embodiment shown in FIG. 13, the thickness D103' is equal to a thickness D103 of the dielectric layer 103 in the embodiment. However, the present disclosure is not limited herein. In another embodiment of the present disclosure, a semiconductor structure can have same top view as shown in FIG. 12 but have a thickness D103' less than a thickness D103 of the dielectric layer 103. The semiconductor structure 22 shown in FIG. 12 and FIG. 13 can be considered as repeating unit of combination of FIG. 9 and FIG. 11. In other embodiments of the present disclosure, other combinations of repeating unit can be used; for example, a semiconductor structure is provided with repeating unit of combination of FIG. 10 and FIG. 8.

Figure 14:
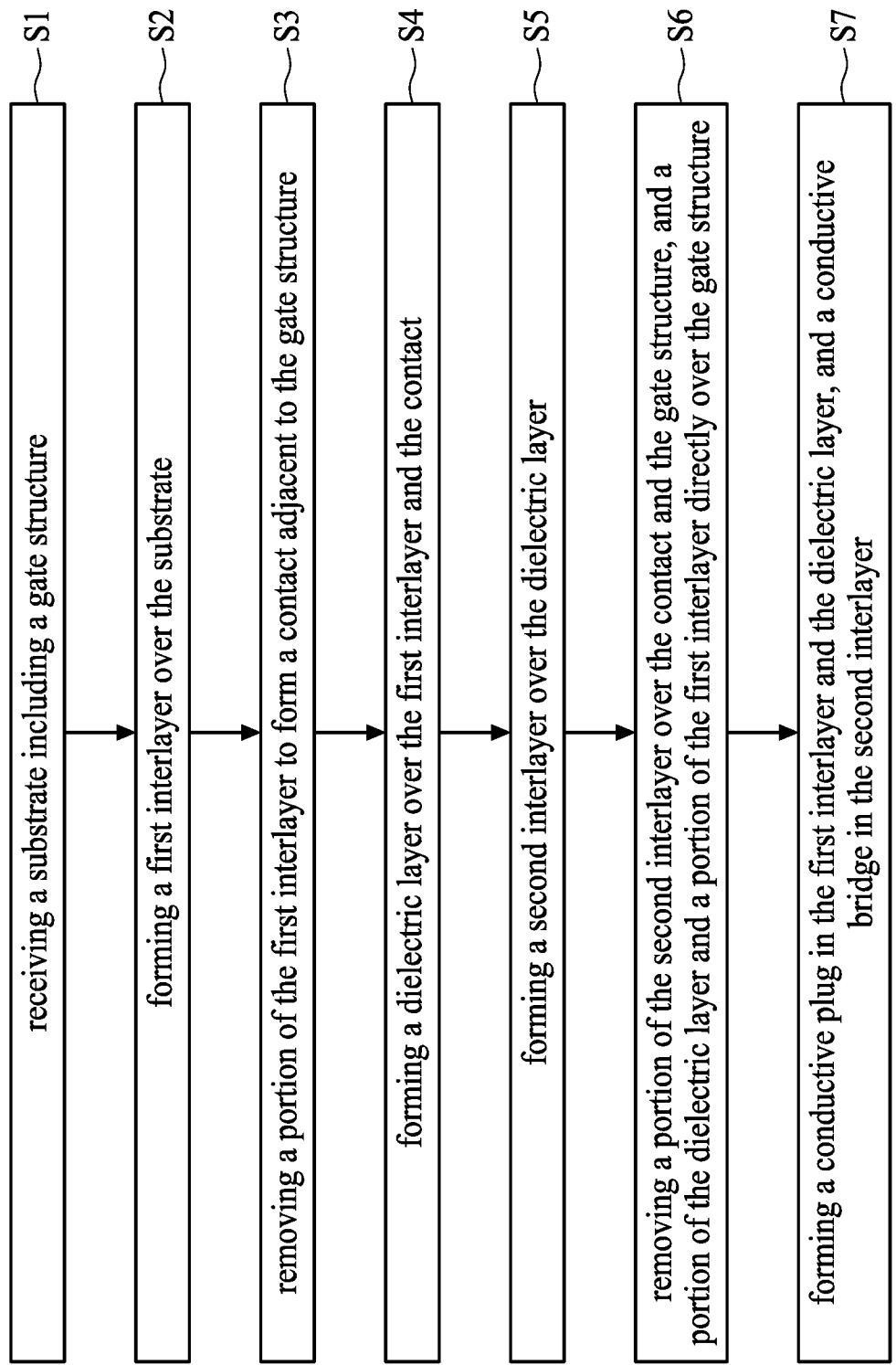
FIG. 14 is a flow chart of a method of forming a semiconductor structure, in accordance with an embodiment of the present disclosure.

The present disclosure also provides a method for forming a semiconductor structure. The method includes: (S1) receiving a substrate 101 including a gate structure 113 surrounded by an insulating layer; (S2) forming a first interlayer 102 over the substrate 101; (S3) removing a portion of the first interlayer 102 to form a contact 121 adjacent to the gate structure 113; (S4) forming a dielectric layer 103 over the first interlayer 102 and the contact 121; (S5) forming a second interlayer 104 over the dielectric layer 103; (S6) removing a portion of the second interlayer 104 over the contact 121 and the gate structure 113, and a portion of the dielectric layer 103 and a portion of the first interlayer 102 directly over the gate structure 113; and (S7) forming a conductive plug 122 in the first interlayer 104 and the dielectric layer 103, and forming a conductive bridge 123 in the second interlayer 104. FIG. 14 is a flow chart of main steps of the method provided by the present disclosure. More details are illustrated below accompanying with FIGS. 15 to 25. Specifically, FIGS. 15 to 25 demonstrate a method for forming the semiconductor structure 20 as an exemplar to illustrate a general concept of a method provided by the present disclosure. Description for all other semiconductor structures provided above (or those not provided in details in the specification but with same principle souls) is omitted for the purpose of simplification and clarity. An ordinary skilled person in the art can understand and modify based on information provided here to fabricate semiconductor structures within the scope of the present disclosure.

Figure 15:
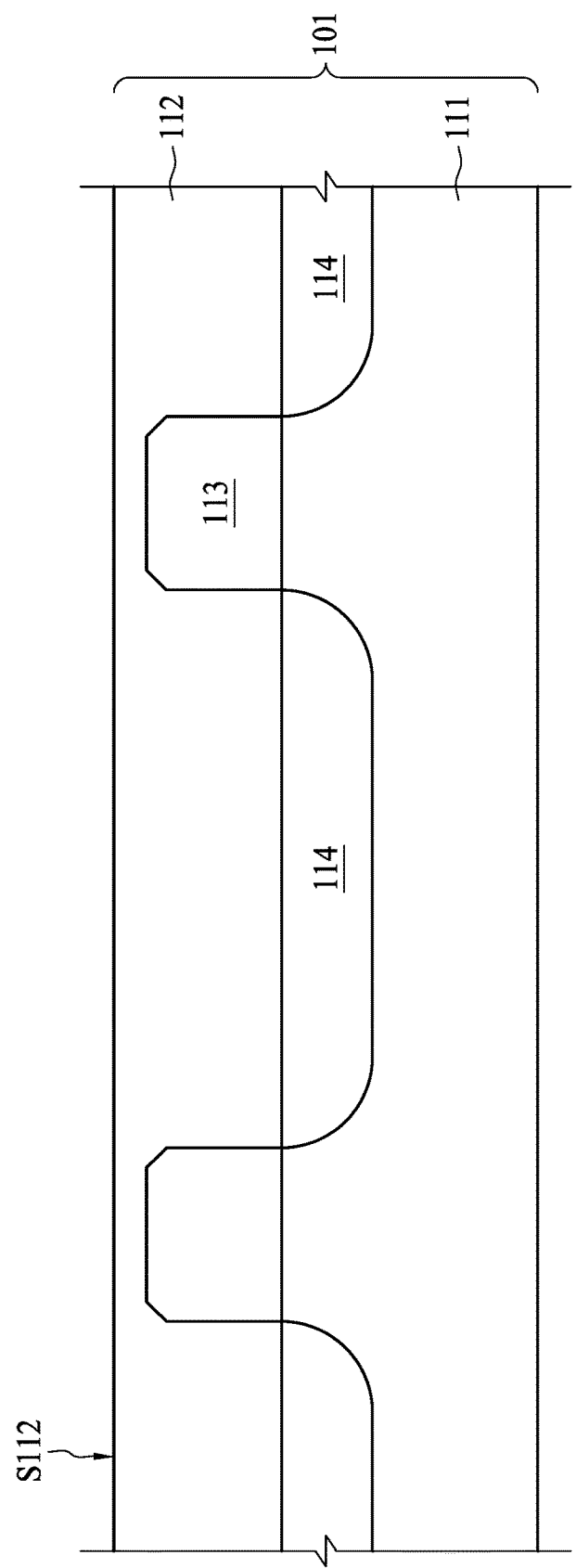
FIG. 15 is a cross section of an intermediate structure of a semiconductor structure, in accordance with an embodiment of the present disclosure.

Referring to FIG. 15, the substrate 101 is provided. The substrate 101 may be a COM substrate and includes a base 111, an insulating layer 112 formed over the base 111, the gate structure 113 formed over the substrate 111 and within the insulating layer 112, and a source/drain region 114 formed adjacent to the gate structure 113 within the base 111. The gate structure 113 and the source/drain region 114 can be formed by conventional technologies, and it is not limited herein. As shown in FIG. 15, a top of the gate structure 113 is inside the insulating layer 112. However in other embodiments of the present disclosure, a top of the gate structure 113 can be coplanar to a top surface S112 of the first interlayer 112.

Figure 16:
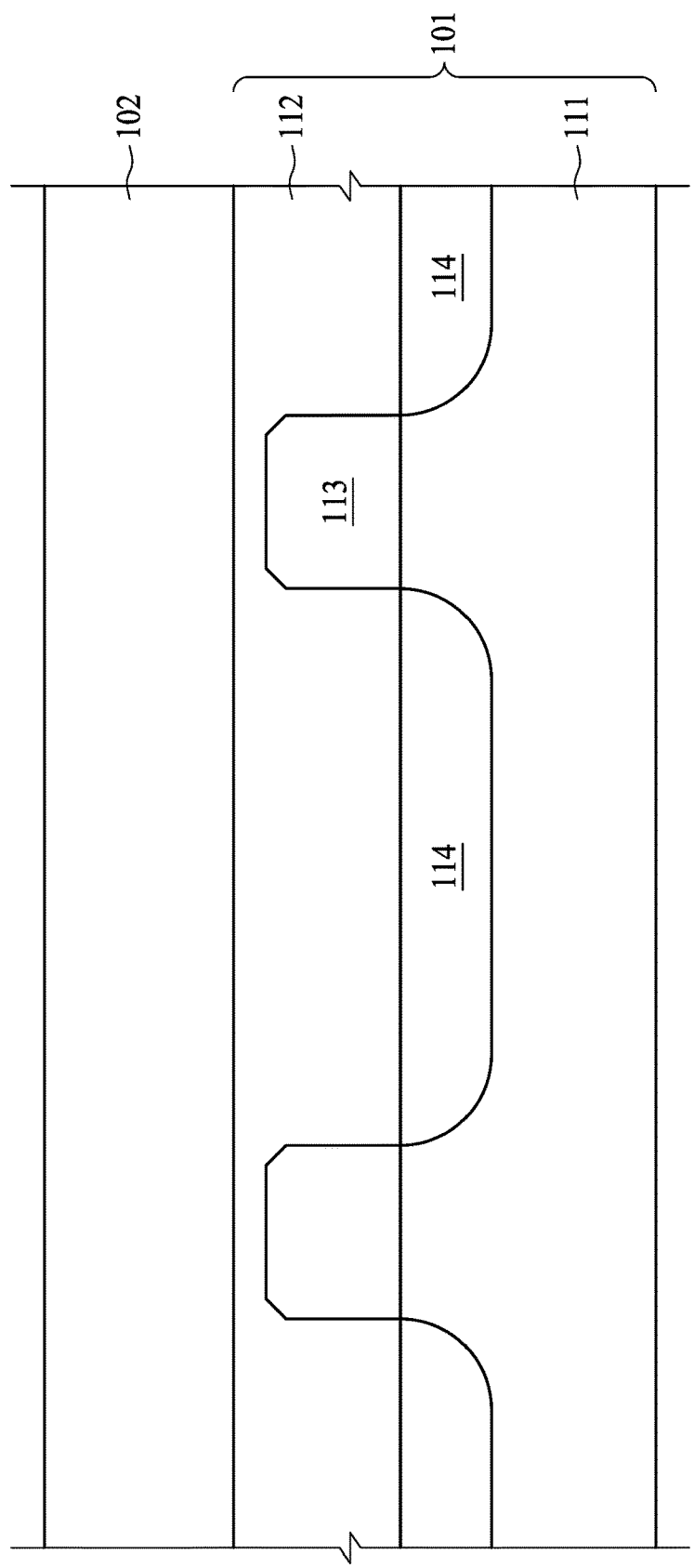
FIG. 16 is a cross section of an intermediate structure of a semiconductor structure, in accordance with an embodiment of the present disclosure.
Figure 17:
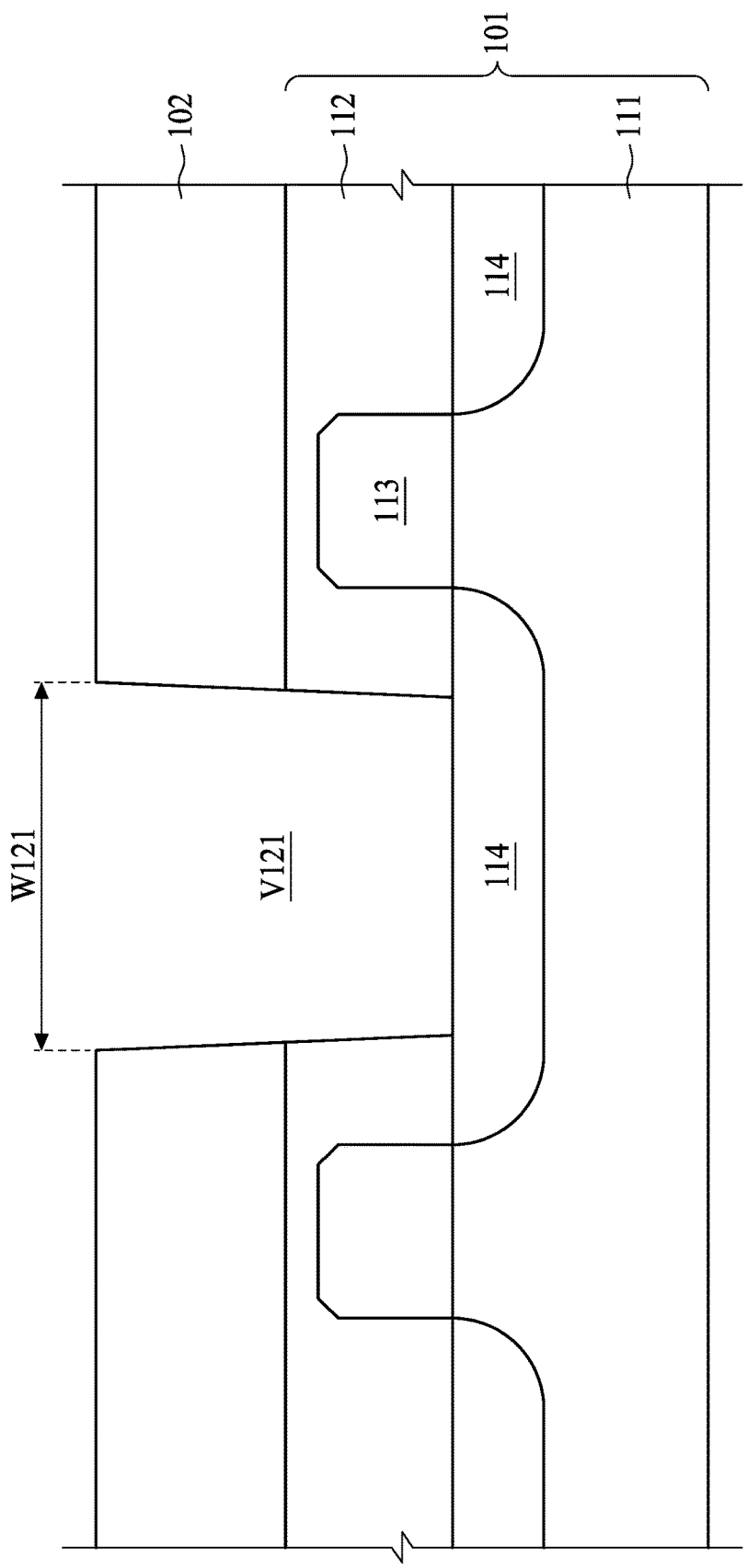
FIG. 17 is a cross section of an intermediate structure of a semiconductor structure, in accordance with an embodiment of the present disclosure.
Figure 18:
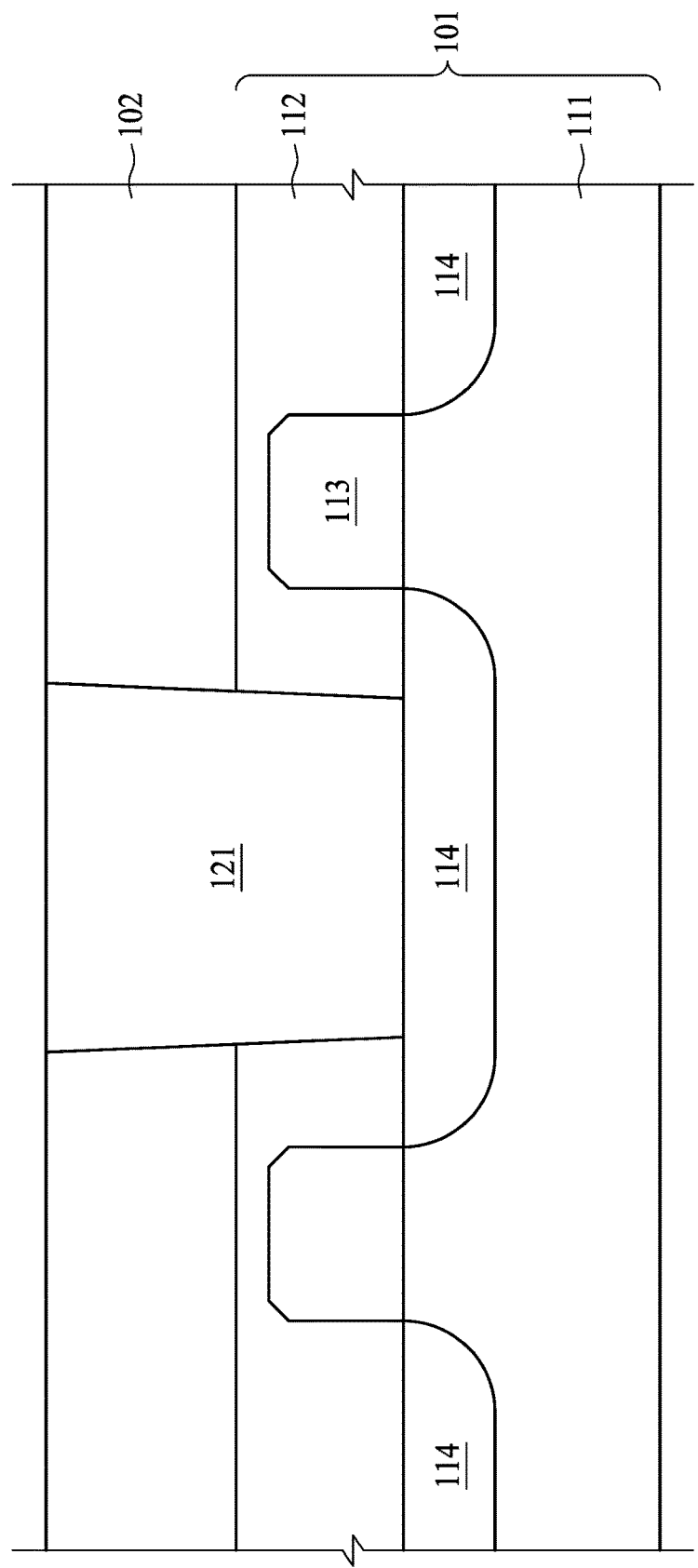
FIG. 18 is a cross section of an intermediate structure of a semiconductor structure, in accordance with an embodiment of the present disclosure.
Figure 19:
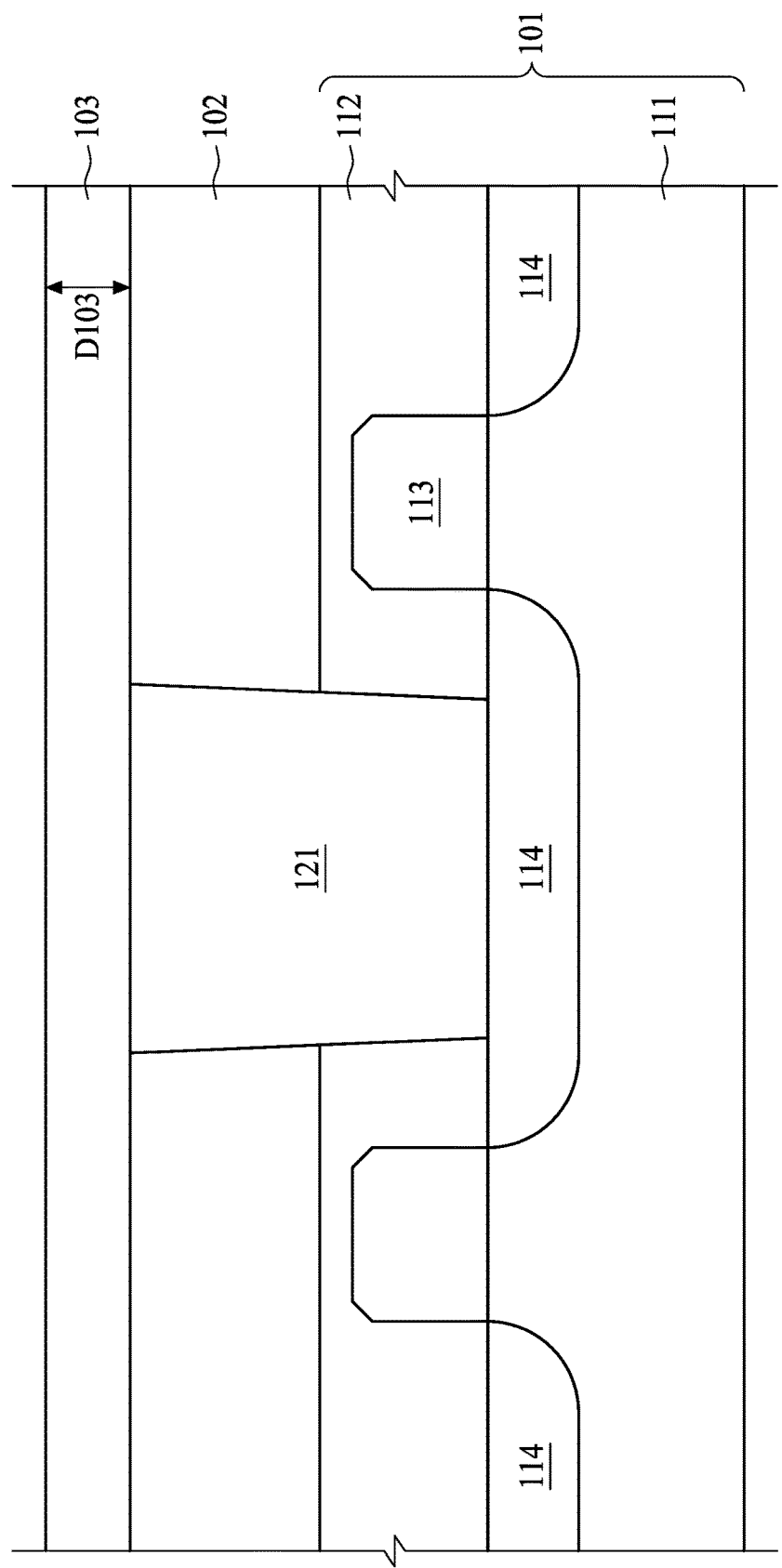
FIG. 19 is a cross section of an intermediate structure of a semiconductor structure, in accordance with an embodiment of the present disclosure.
Figure 20:
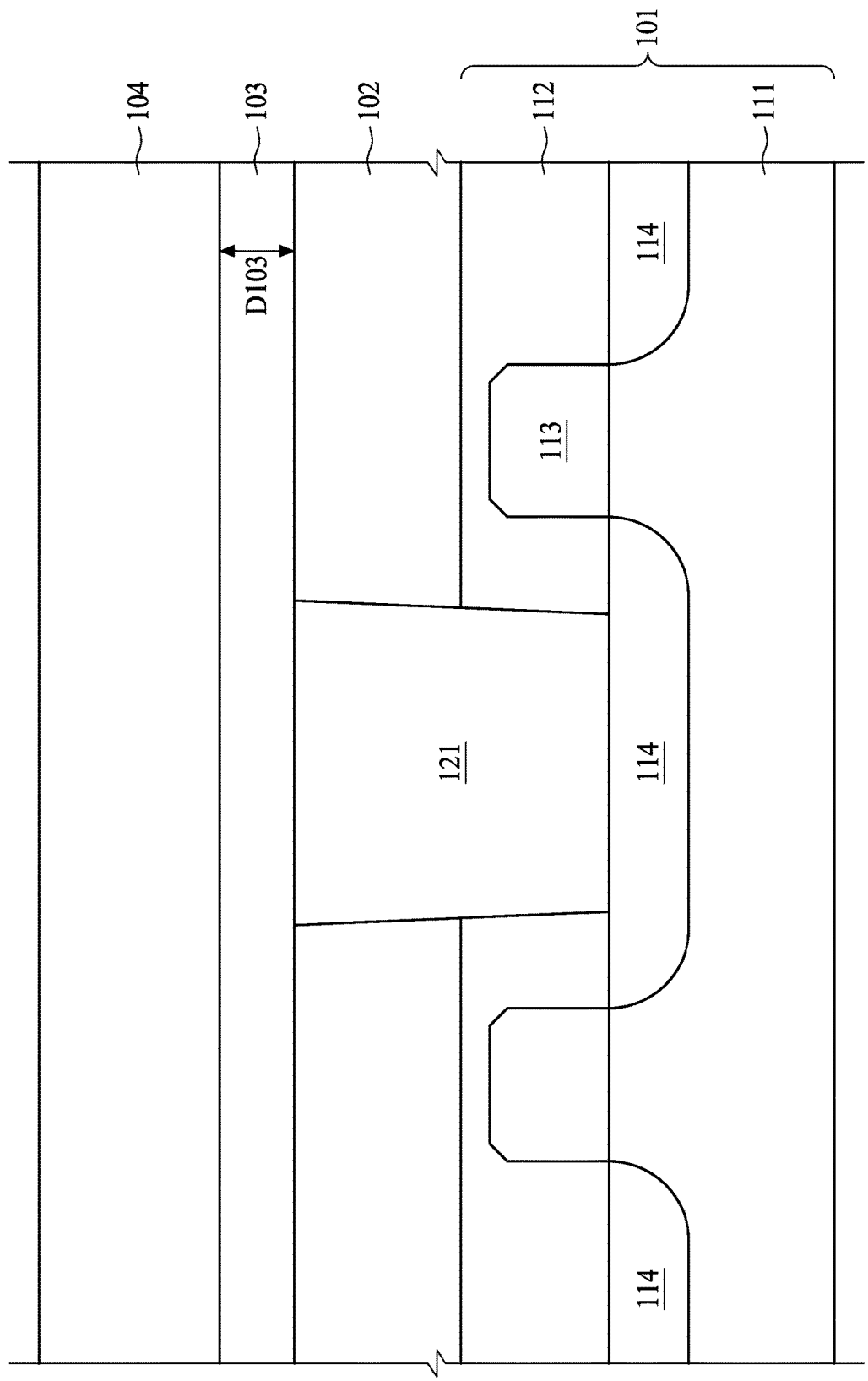
FIG. 20 is a cross section of an intermediate structure of a semiconductor structure, in accordance with an embodiment of the present disclosure.
Figure 21:
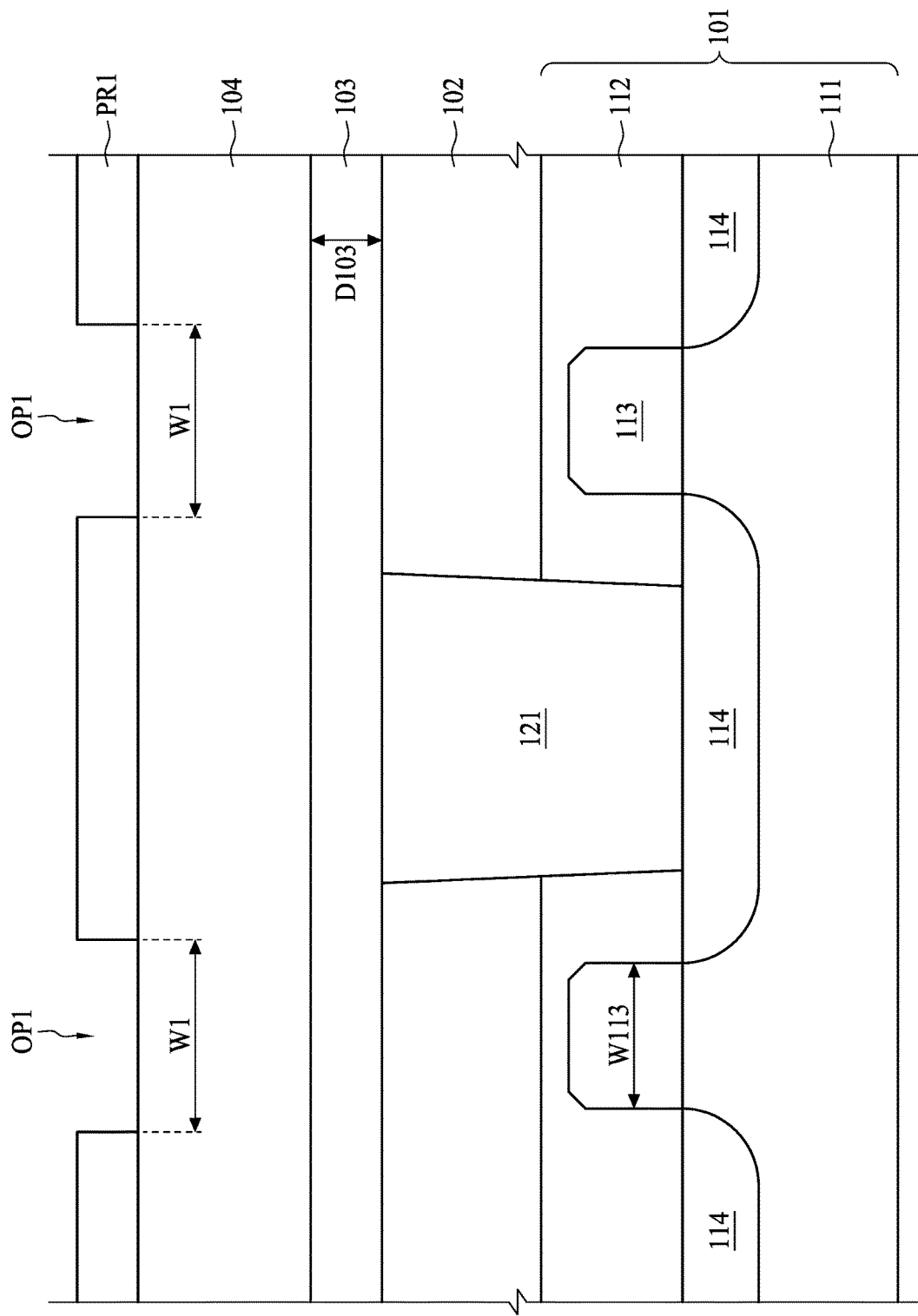
FIG. 21 is a cross section of an intermediate structure of a semiconductor structure, in accordance with an embodiment of the present disclosure.

Referring to FIGS. 16 to 18, the first interlayer 102 is formed over the substrate 101 by, for example, deposition process. The first interlayer 102 for instance is an oxide layer. Then a portion of the first interlayer 102 and a portion of the insulating layer 112 adjacent to and between the gate structures 113 are removed to form a contact via V121 over the source/drain region 114, between the gate structures 113 and within the first interlayer 102. Then conductive material is filled in the contact via V121 to form the conductive plug 121. The conductive material for example is a metal, such as copper, tungsten, aluminum, and combination thereof. A planarization process, e.g. CMP (chemical mechanical planarization), is optionally performed to make a top of the contact 121 and a top of the first interlayer 102 coplanar.

Figure 22:
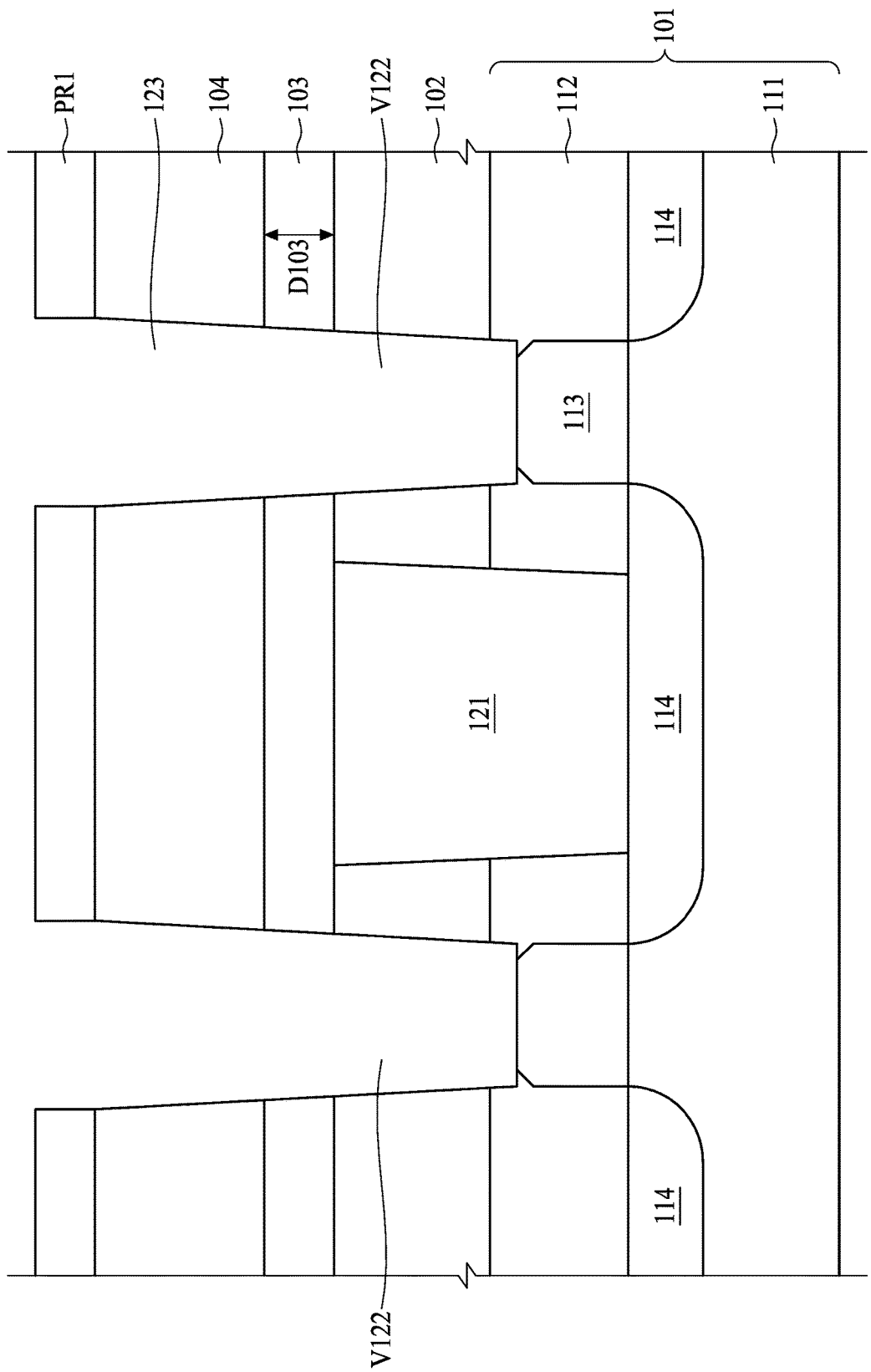
FIG. 22 is a cross section of an intermediate structure of a semiconductor structure, in accordance with an embodiment of the present disclosure.

Referring to FIGS. 19 to 24, the dielectric layer 103 having a thickness D103 is formed over the first interlayer 102 and the contact 121, and the second interlayer 104 is formed over the dielectric layer 103. A portion of the second interlayer 104, a portion of the dielectric layer 103, a portion of the first inter layer 102 directly over the gate structures 113 are removed to form a plug via V122. Photolithographic technology is used to in the embodiment. A photoresist layer PR1 is formed and patterned over the second interlayer 104. The photoresist layer PR1, or in other embodiments a first hard mask, has a first opening OP1 directly over the gate structures 113. The portion of the second interlayer 104, the portion of the dielectric layer 103, the portion of the first interlayer 102 are etched and removed using the photoresist PR1 as a mask to form the plug via V122. As shown in FIG. 22, the plug via V122 is wider at top and narrower at bottom due to plasma gas has a lower removal rate at bottom than that of at top of the plug via V122. However, it is possible to finely adjust parameters of the etching process to form a rectangular plug via V122. Shapes of the plug via V122 and conductive plug 122 are not limited herein. The photoresist PR1 used in the step of forming the plug via V122 can be a step for forming a source/drain contact via in a conventional manufacturing process.

Figure 23:
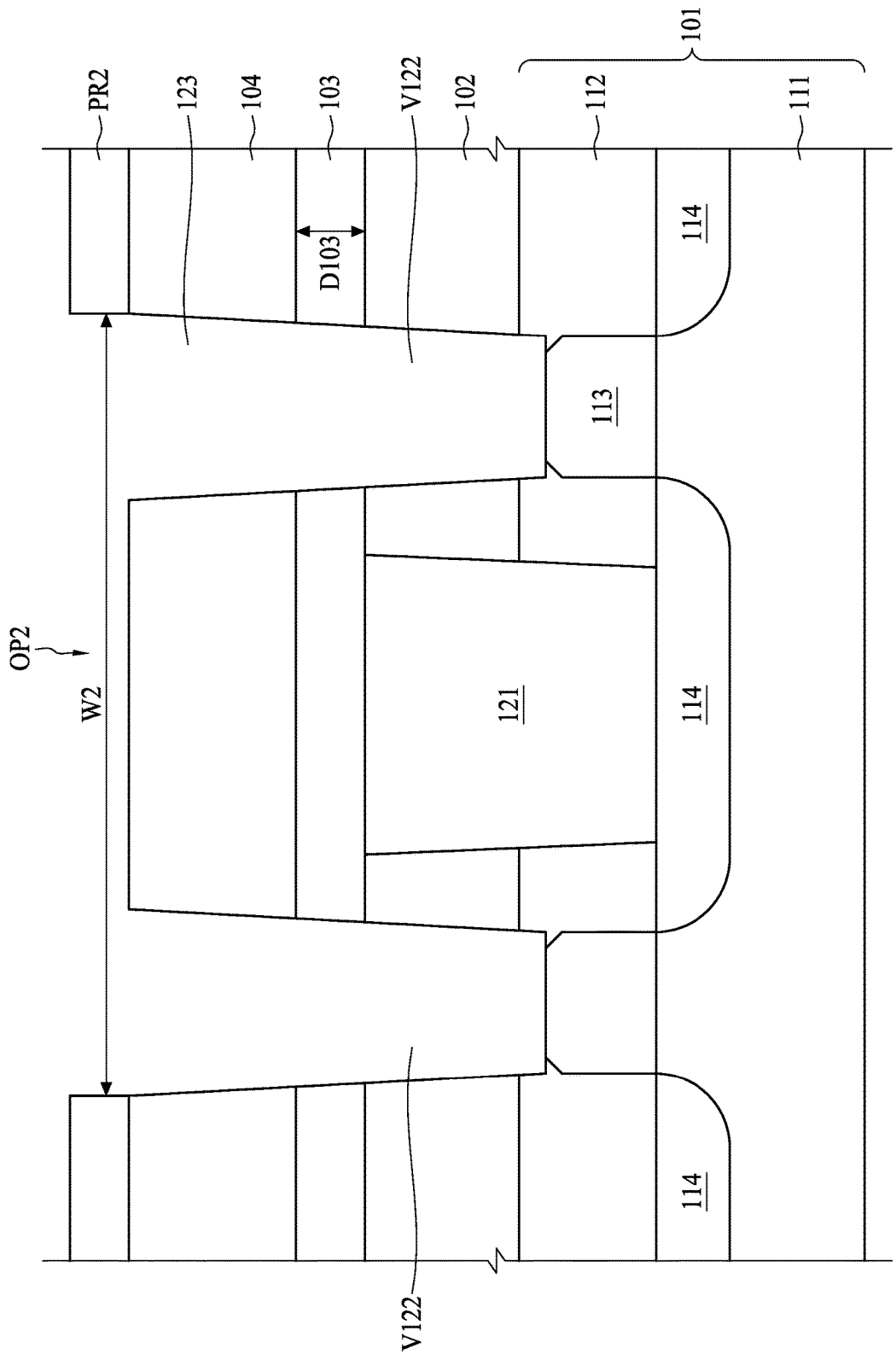
FIG. 23 is a cross section of an intermediate structure of a semiconductor structure, in accordance with an embodiment of the present disclosure.
Figure 24:
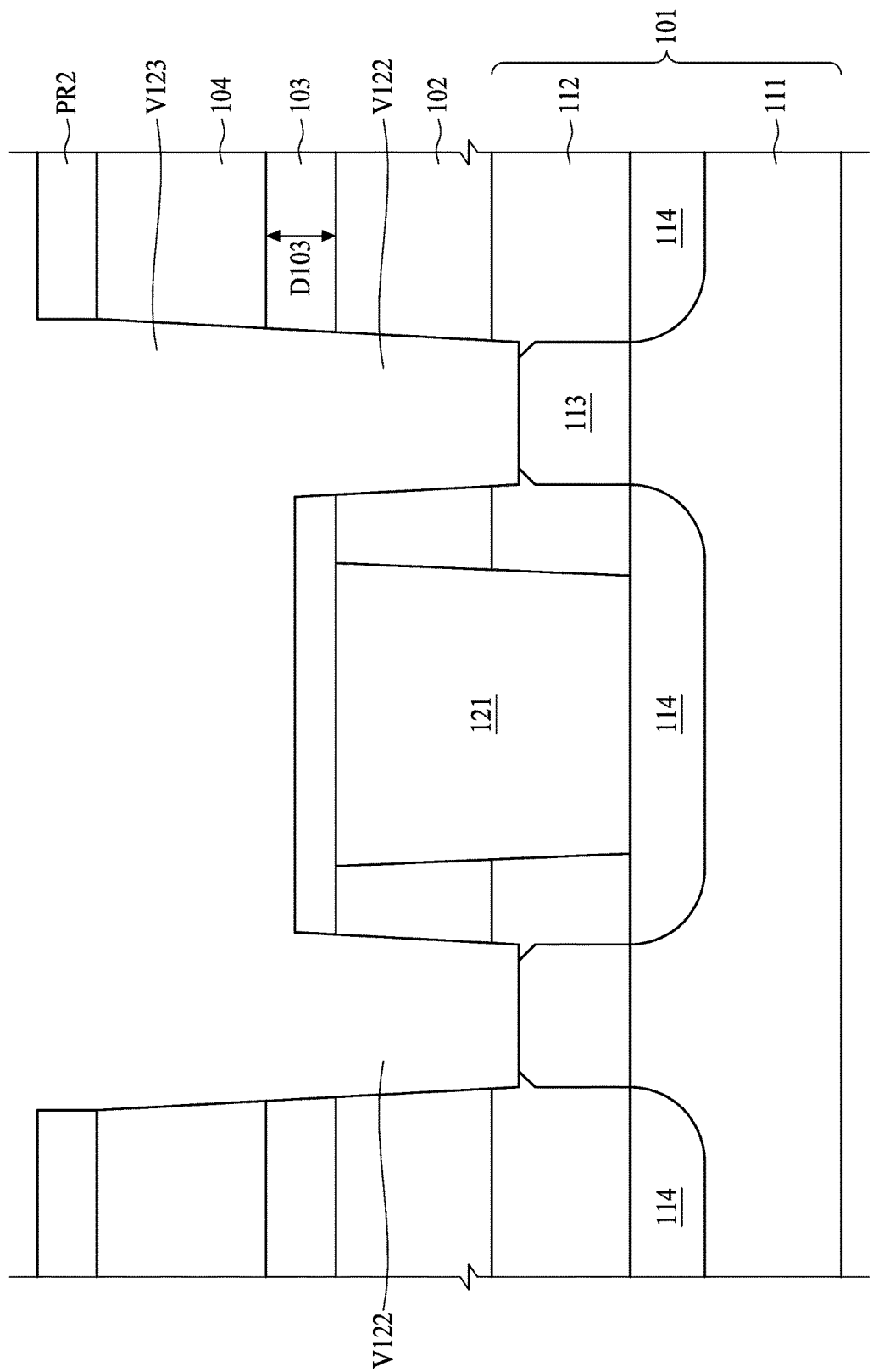
FIG. 24 is a cross section of an intermediate structure of a semiconductor structure, in accordance with an embodiment of the present disclosure.

The photoresist PR1 is removed and a photoresist PR2, or in other embodiments a second hard mask, is formed and patterned over the second interlayer 104 as shown in FIG. 23. The photoresist PR2 utilized in operation forming a bridge via V123 shares a similar pattern for forming a bridge contact connecting adjacent source/drain contact at the level of the dielectric layer 103 (not shown). The photoresist PR2 has a second opening OP2 directly over the contact 121 and overlaps with at least a portion of the first opening OP1. The portion of the second interlayer 104, and optionally a portion of the dielectric layer 103, are removed by, for instance, plasma dry etch, to form a bridge via V123 directly over the contact 121. In some embodiments, the bridge via V123 occupies more than 50% of the thickness of the dielectric layer 103. For instance, plasma dry etch is timed to remove half of the thickness of the dielectric layer 103. The remaining thickness of the dielectric layer 103 directly over the contact 121 may be determined by various manufacturing factors and can be as thin as possible if a suitable uniformity can be achieved and as far as greater capacitance is concerned. In the embodiment shown in FIG. 24, the bridge via V123 traverses over the contact 121; and in another embodiment, the bridge via V123 is over at least a portion of the contact 121 from a cross sectional view. The bridge via V123 overlaps with at least a portion of the plug via V122. Additionally, a fabrication sequence of the bridge via V123 and the plug via V122 is not limited herein. Afore illustrations showing a fabrication sequence of the plug via V122 prior to the bridge via V123, but in other embodiments it can be vice versa.

Figure 25:
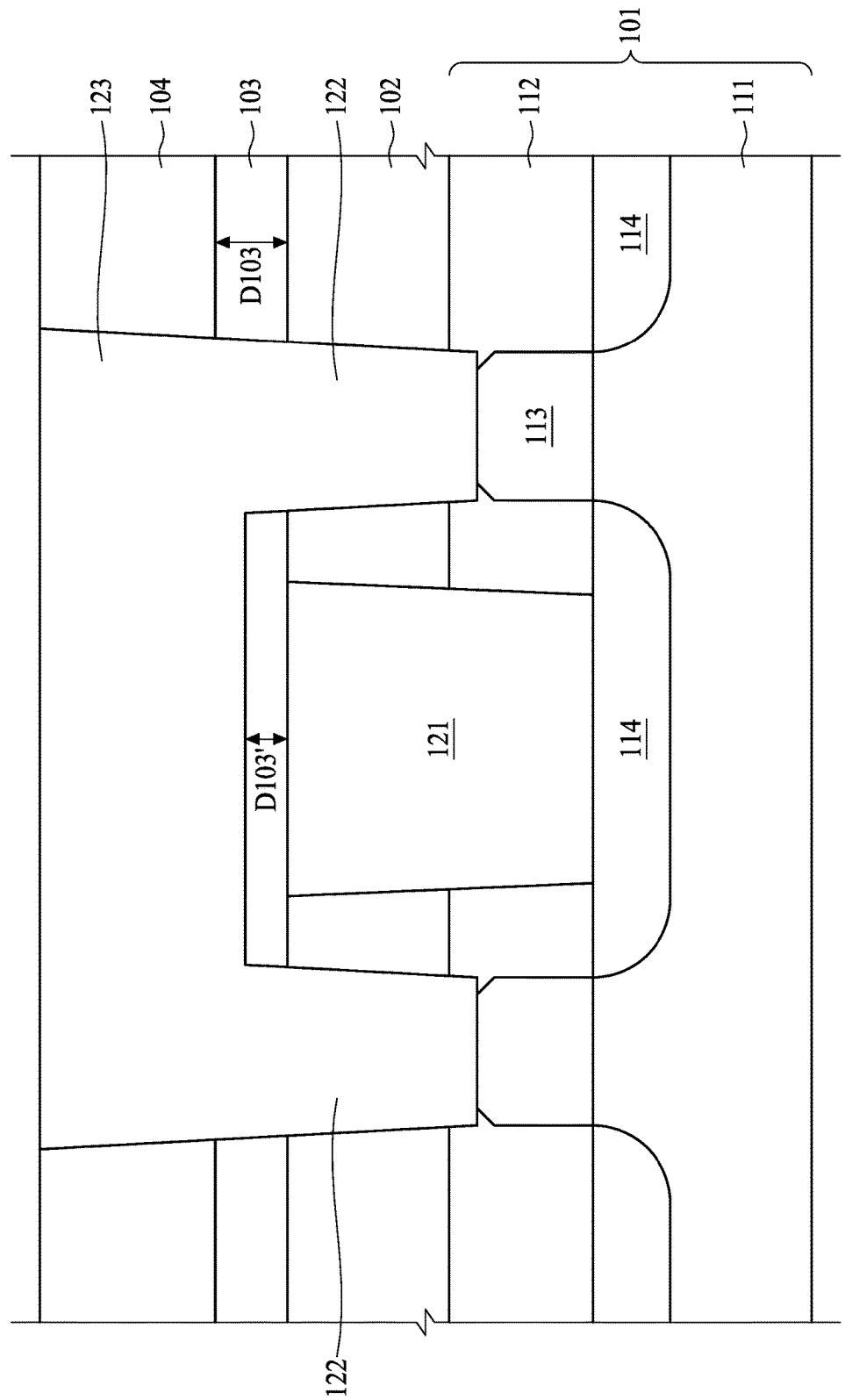
FIG. 25 is a cross section of a semiconductor structure, in accordance with an embodiment of the present disclosure.

Referring to FIG. 25, conductive material is filled into the plug via V122 and the bridge via V123 to form the conductive plug 122 and the conductive bridge 123. In the embodiment shown in FIGS. 24-25, a portion of the dielectric layer 103 is removed in the step of forming the bridge via V123. A distance between the conductive bridge 123 and the contact 121 is controlled by time duration of the etching process. For example, materials of the dielectric layer 103 and the second interlayer 104 are different and have different etch selectivity to a predetermined etchant. When the dielectric layer 103 has a higher selectivity to the predetermined etchant, etching rate is dropped when the process reaches the dielectric layer 103, and thus a thickness of removed dielectric layer 103 can be controlled by adjustment of time duration of etching process on the dielectric layer 103. In addition, the embodiment of the semiconductor structure 21 as shown in FIG. 9 can be achieved by controlling the etching process to stop at an exposure of the dielectric layer 103. Similar to the plug via V122 and conductive plug 122, shapes of the bridge via V123 and conductive bridge 123 are not limited herein.

In the embodiment as illustrated in FIGS. 15 to 25, a width W113 of the gate structure 131 is less than a width W1 of the first opening OP 1, the width W1 is less than a width W121 of the contact 121, and the width W121 is less than a width W2 of the second opening from a top view perspective.

Operation of forming the bridge via V123 can be integrated with formation of voltage dependent resistor and/or formation of a first metal line (the metal line right above the CMOS, or device layer) in the interconnection structure over a CMOS substrate or a field effect transistor substrate in the conventional manufacturing process. And thus, a semiconductor structure and a capacitor structure thereof provided by the present disclosure can be integrated into a conventional semiconductor structure or a conventional capacitor structure.

The structures provided by the present disclosure comparative to a conventional structure can have extra capacitor and therefore to increase capacitance of the structure. For another exemplar application, a gate oxide capacitor can be integrated the gate structure to further improve capacitance of the semiconductor structure and the capacitor structure of the present disclosure. The structure provided by the present disclosure relative to conventional may have extra capacitor structure, increment in parallel area of a stacked conductor-insulator-conductor structure, and reduction in thickness of the gap between the two conductors. For instance, a tube contact capacitor structure in accordance with an embodiment of the present disclosure including a structure shown in FIG. 8 can have over 100 times of capacitance than that of a conventional CMOS structure. Moreover, a method of forming the semiconductor structure and/or the capacitor structure can also be integrated into a conventional semiconductor manufacturing process without introducing extra processing or technologies.

Present disclosure provides a semiconductor structure, including a substrate having a gate structure, a first interlayer over the substrate, a contact adjacent to the gate structure and penetrating through the first interlayer, a dielectric layer over the first interlayer and the contact, a conductive plug electrically connecting with the gate structure and penetrating the first interlayer, and a conductive bridge electrically connecting with the conductive plug and being directly over the contact, the conductive bridge being separated from the contact by a portion of the dielectric layer.

Present disclosure provides a capacitor structure, including a substrate having a plurality of gate structures; a first interlayer over the substrate; a contact being between two adjacent gate structures of the plurality of gate structures and penetrating through the first interlayer; a dielectric layer over the first interlayer and the contact; a plurality of conductive plugs penetrating the first interlayer and electrically connecting with the plurality of gate structures; and a conductive bridge electrically connecting with two adjacent conductive plugs and traversing over the contact, the conductive bridge being separated from the contact by at least a portion of the dielectric layer.

Present disclosure provides a method for forming a semiconductor structure, including: receiving a substrate having a gate structure; forming a first interlayer over the substrate; removing a portion of the first interlayer to form a contact adjacent to the gate structure; forming a dielectric layer over the first interlayer and the contact; forming a second interlayer over the dielectric layer; removing a portion of the second interlayer over the contact and the gate structure, and a portion of the dielectric layer and a portion of the first interlayer directly over the gate structure; forming a conductive plug in the first interlayer and the dielectric layer; and forming a conductive bridge in the second interlayer and separated from the contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a substrate including a gate structure;
   a first interlayer over the substrate;
   a contact adjacent to the gate structure and penetrating through the first interlayer;
   a dielectric layer over the first interlayer and the contact;
   a conductive plug electrically connecting with the gate structure and penetrating the first interlayer; and
   a conductive bridge electrically connecting with the conductive plug and being directly over the contact, the conductive bridge being separated from the contact by a portion of the dielectric layer.

2. The semiconductor structure of claim 1, further comprising:
   a second interlayer over the dielectric layer, wherein the conductive bridge is surrounded by the second interlayer.

3. The semiconductor structure of claim 1, wherein the substrate is a CMOS substrate and further includes:
a base;
a source/drain region adjacent to the gate structure and within the base; and
an insulating layer over the base, between the gate structure and the contact, and directly adjacent to the first interlayer.

4. The semiconductor structure of claim 3, wherein the contact penetrates through the insulating layer and electrically connects with the source/drain region.

5. The semiconductor structure of claim 1, wherein the conductive plug is separated from the contact by the first interlay.

6. The semiconductor structure of claim 1, wherein a thickness of the portion of the dielectric layer between the conductive bridge and the contact is less than a thickness of the dielectric layer free from coverage by the conductive bridge.

7. The semiconductor structure of claim 1, wherein a thickness of the portion of the dielectric layer between the conductive bridge and the contact is equal to a thickness of the dielectric layer free from coverage by the conductive bridge.

8. The semiconductor structure of claim 1, wherein the first interlayer is a dielectric layer and materials of the dielectric layer and the first interlayer are different.

9. A capacitor structure, comprising:
a substrate including a plurality of gate structures;
a first interlayer over the substrate;
a contact being between two adjacent gate structures of the plurality of gate structures and penetrating through the first interlayer;
a dielectric layer over the first interlayer and the contact;
a plurality of conductive plugs penetrating the first interlayer and electrically connecting with the plurality of gate structures; and
a conductive bridge electrically connecting with two adjacent conductive plugs and traversing over the contact, the conductive bridge being separated from the contact by at least a portion of the dielectric layer.

10. The capacitor structure of claim 9, wherein the plurality of conductive plugs is separated from the contact by the first interlay.

11. The capacitor structure of claim 9, wherein a thickness of the portion of the dielectric layer between the conductive bridge and the contact is less than a thickness of the dielectric layer free from coverage by the conductive bridge.

12. The capacitor structure of claim 9, wherein a thickness of the at least the portion of the dielectric layer between the conductive bridge and the contact is equal to a thickness of the dielectric layer free from coverage by the conductive bridge.

13. The capacitor structure of claim 9, wherein the plurality of the conductive plugs is directly over the plurality of gate structures respectively, and the conductive bridge contacts with the two adjacent conductive plugs and have a longitudinal direction perpendicular to a longitudinal direction of the contact.

14. The capacitor structure of claim 9, wherein the conductive bridge is extending parallel to a longitudinal direction of the contact from a top view perspective.

15. The capacitor structure of claim 9, wherein the plurality of the gate structures and a plurality of contacts are intervally disposed along a direction perpendicular to a longitudinal direction of the gate structures, and the conductive bridge is directly over the plurality of the contacts.

16. A method for forming a semiconductor structure, comprising:
receiving a substrate including a gate structure;
forming a first interlayer over the substrate;
removing a portion of the first interlayer to form a contact adjacent to the gate structure;
forming a dielectric layer over the first interlayer and the contact;
forming a second interlayer over the dielectric layer;
removing a portion of the second interlayer over the contact and the gate structure, and a portion of the dielectric layer and a portion of the first interlayer directly over the gate structure;
forming a conductive plug in the first interlayer and the dielectric layer; and
forming a conductive bridge in the second interlayer and separated from the contact.

17. The method of claim 16, wherein concurrently with removing the portion of the second interlayer over the contact and the gate structure, a portion of the dielectric layer directly over the contact is removed.

18. The method of claim 16, wherein the portion of the second interlayer over the contact and the gate structure is removed by an etching process and the etching process is stopped at an exposure of the dielectric layer.

19. The method of claim 16, wherein the portion of the dielectric layer and the portion of the first interlayer directly over the gate structure are removed prior to the portion of the second interlayer over the contact and the gate structure.

20. The method of claim 16, wherein the portion of the second interlayer over the contact and the gate structure is removed with a first photoresist having a first opening, the portion of the dielectric layer and the portion of the first interlayer directly over the gate structure is removed with a second photoresist having a second opening, and the second opening overlaps with at least a portion of the first opening.

* * * * *